(12) United States Patent
Anzai

(10) Patent No.: US 6,784,454 B2
(45) Date of Patent: Aug. 31, 2004

(54) CONTACT BETWEEN ELEMENT TO BE DRIVEN AND THIN FILM TRANSISTOR FOR SUPPLYING POWER TO ELEMENT TO BE DRIVEN

(75) Inventor: Katsuya Anzai, Gifu (JP)

(73) Assignee: Sanyo Electric Co., Ltd. (JP)

( * ) Notice: Subject to any disclaimer, the term of this patent is extended or adjusted under 35 U.S.C. 154(b) by 147 days.

(21) Appl. No.: 09/966,000

(22) Filed: Sep. 28, 2001

(65) Prior Publication Data

US 2002/0075254 A1 Jun. 20, 2002

(30) Foreign Application Priority Data

Sep. 29, 2000 (JP) .......................................... 2000-300982
Sep. 14, 2001 (JP) .......................................... 2001-279802

(51) Int. Cl.[7] ............................................. H01L 29/04
(52) U.S. Cl. .............................. 257/59; 359/59; 257/69; 257/72; 257/351
(58) Field of Search ................................ 359/59; 257/69, 257/72, 351

(56) References Cited

U.S. PATENT DOCUMENTS 5,173,792 A * 12/1992 Matsueda ..................... 349/54

* cited by examiner

*Primary Examiner*—David Nelms
*Assistant Examiner*—Mai-Huong Tran
(74) *Attorney, Agent, or Firm*—Cantor Colburn LLP

(57) ABSTRACT

The number of TFT (20), thin film transistors for controlling the supplied power to an element to be driven such as an organic EL element (50) which operates based on the supplied power, provided between the element to be driven and a power supply line VL, is equal to n, where n is an integer greater than or equal to two. The n TFTs (20) and corresponding element to be driven (50) are electrically connected by contact points, the number of which is less than or equal to (n−1). It is possible to improve the reliability as a semiconductor device and a display device, and, at the same time, to secure maximum actual operation region (illumination region for an illuminating element) of the element to be driven.

7 Claims, 18 Drawing Sheets

ILLUMINATION REGION

CONTACT BETWEEN ELEMENT TO BE DRIVEN AND THIN FILM TRANSISTOR FOR SUPPLYING POWER TO ELEMENT TO BE DRIVEN

BACKGROUND OF THE INVENTION

1. Field of the Invention

The present invention relates to an electroluminescent display device, and in particular, to transistors constructing the circuit structure in the pixel section of an electroluminescent display device.

2. Description of the Related Art

An electroluminescence (hereinafter referred to as EL) display device which uses an EL element which is a self-illuminating element as an illumination element in each pixel has attracted a strong interest as an alternative display device for a display device such as a liquid crystal display device (LCD) and a CRT because the EL display device has advantages such as thin width and low power consumption, in addition to the advantage of being self-illuminating. Such an EL display device has thus been researched.

In particular, there is a high expectation for an active matrix type EL display device in which a switching element such as, for example, a thin film transistor for individually controlling an EL element is provided for each pixel and EL elements are controlled for each pixel, as a high resolution display device.

FIG. 1 shows a circuit structure for one pixel in an active matrix type EL display device having m rows and n columns. In the EL display device, a plurality of gate lines GL extend on a substrate in the row direction and a plurality of data lines DL and power supply lines VL extend on the substrate in the column direction. Each pixel has an organic EL element 50, a switching TFT (first TFT) 10, an EL element driving TFT (second TFT) 20, and a storage capacitor Cs.

The first TFT 10 is connected to the gate line GL and data line DL, and is turned on by receiving a gate signal (selection signal) on its gate electrode. A data signal which is being supplied on the data line DL at this point is then held in the storage capacitor Cs connected between the first TFT 10 and the second TFT 20. A voltage corresponding to the data signal is supplied to the gate electrode of the second TFT 20 via the first TFT 10. The second TFT 20 then supplies a current, corresponding to the voltage value, from the power supply line VL to the organic EL element 50. In this manner, the organic EL element in each pixel is illuminated at a brightness based on the data signal, and a desired image is displayed.

The organic EL element is a current-driven element which is illuminated by supplying a current to an organic emissive layer provided between a cathode and an anode. The data signal output onto the data line DL, on the other hand, is a voltage signal with an amplitude corresponding to the display data. Thus, conventionally, in order to accurately illuminate the organic EL element by such a data signal, in an organic EL display device, a first TFT 10 and a second TFT 20 are provided in each pixel.

The display quality and reliability of the organic EL display devices described above remain insufficient, and the characteristic variations in the first and second TFTs 10 and 20 must be dissolved. In particular, reduction in characteristic variation in the second TFT 20 for controlling the amount of current supplied from the power supply line VL to the organic EL element 50 is desired, because such variation directly causes variation in the illumination brightness.

Moreover, it is preferable to construct the first and second TFTs 10 and 20 from a polycrystalline silicon TFT which has quick operation speed and which can be driven by a low voltage. In order to obtain a polycrystalline silicon, an amorphous silicon is polycrystallized by laser annealing. Because of various reasons such as, for example, energy variation in the irradiating laser at the irradiation surface, the grain size of the polycrystalline silicon is not uniform. When grain size is not uniform, in particular around the TFT channel, there is a problem in that the on-current characteristic or the like of the TFT may also vary.

SUMMARY OF THE INVENTION

The present invention is conceived to solve the above problem, and one object of the present invention is to improve the characteristic by alleviating variations among TFTs, and at the same time, to efficiently provide a plurality of TFTs for controlling an element to be driven, in a device having an organic EL element or the like as the element to be driven.

According to one aspect of the present invention, there is provided a semiconductor device comprising n thin film transistors for controlling the power supplied to an element to be driven which operates based on the supplied power, where n is an integer equal to or greater than 2, provided between the element to be driven and a power supply line for supplying power to the element to be driven, wherein the number of contact points for electrically connecting the n thin film transistors and corresponding element to be driven is equal to or less than (n−1).

From the viewpoint of reliability of the power supply to the element to be driven and of variation prevention, provision of a plurality of element driving thin film transistors for supplying power to the element to be driven is highly effective. On the other hand, for a case where the element to be driven is, for example, an emissive element, the contact section is usually a non-illuminating region. Therefore, by setting the number of contacts between n thin film transistors for supplying power to the element to be driven and the element to be driven to be equal to or less than (n−1), it is possible to improve the reliability as a device, while simultaneously securing a maximum actual operation region (illumination region for an emissive element) for the element to be driven.

According to another aspect of the present invention, there is provided a semiconductor device comprising a thin film transistor for controlling the power supplied to an element to be driven, provided between the element to be driven which operates based on the supplied power and a power supply line for supplying power to the element to be driven, wherein the thin film transistor and corresponding element to be driven are electrically connected to each other by a wiring layer; and the contact position between the wiring layer and the thin film transistor is placed to be distant from the contact position between the wiring layer and the element to be driven.

By placing the contact position between the wiring layer and the thin film transistor distant from the contact position between the wiring layer and the element to be driven, the formation of the element to be driven, which in many cases is formed at a layer above the wiring layer, on a more flat surface is facilitated. The thin film transistor and the wiring layer are separated by an insulation layer and the contact between the thin film transistor and the wiring layer is achieved through a contact hole formed on the insulation layer. The connection between the wiring layer and the element to be driven is achieved through a contact hole formed on another insulation layer for insulating the wiring layer and the element to be driven. Therefore, when the contact hole for connecting the thin film transistor and the wiring layer is formed to overlap to the position of the contact hole for connecting the wiring layer and the element to be driven, the element to be driven, which is formed at the uppermost layer, would be formed on top of an uneven surface with a large height difference due to two (steps of) contact holes. When an emissive element, for example, an organic EL element which uses an organic compound in the emissive layer, is used as the element to be driven, electric field concentration or the like tends to occur at the layer which includes the organic compound if the flatness of the formation surface is not good, and a dark spot which cannot illuminate tends to be generated from such electric field concentration. Therefore, by placing at a distance the contact between the wiring layer and the element to be driven from the contact between the thin film transistor and the wiring layer, the flatness of the formation region of the element to be driven can be improved.

According to another aspect of the present invention, in the semiconductor device, it is preferable that the element to be driven is an emissive element which includes an emissive element layer between a first electrode and a second electrode; a contact hole is formed on an insulation layer which is formed above the wiring layer; the wiring layer is connected through the contact hole to the first electrode of the emissive element which is formed on top of the insulation layer and covering the contact hole; at least the contact hole region of the first electrode is covered by a flattening layer for planarization; and the emissive element layer is formed above the first electrode and the flattening layer.

By covering the contact hole region of the first electrode by a flattening layer, that is, by filling the recessed section caused by the presence of the contract hole by the flattening layer, a surface which has a very high flatness can be obtained by the first electrode and the flattening layer. Thus, by forming the emissive element layer on the surface with very high flatness, the reliability of the element can be improved.

According to another aspect of the present invention, there is provided a semiconductor device comprising a thin film transistor for controlling power supplied to an element to be driven which operates based on the power supplied and which includes an emissive element layer between a first electrode and a second electrode, the thin film transistor being provided between the element to be driven and a power supply line for supplying power to the element to be driven, wherein the thin film transistor and the corresponding element to be driven are directly or indirectly, and electrically connected to each other at a contact hole formed on an insulation layer for separating the thin film transistor which is formed at a lower layer and the element to be driven; at least the contact hole region of the first electrode is covered by a flattening layer; and the emissive element layer is formed above the first electrode and the flattening layer.

An emissive element layer is formed above the first electrode, but, because the recess section on the first electrode generated by the presence of the contact hole is covered by a flattening layer, the first electrode and the flattening layer can create a very flat surface even when the recess section is deep such that the reliability of the element can be improved by forming the emissive element layer on top of the surface with a high flatness.

According to another aspect of the present invention, it is preferable that the element to be driven is an organic electroluminescence element which employs an organic compound as an emissive layer. Although such an organic EL element has high brightness and wider selection ranges for the illumination color and material, because the organic EL element is current driven, variation in the amount of supplied current causes a variation in the illumination brightness. By using the circuit structure of the pixel or placement as described above, it is possible to easily maintain uniformity of the supplied current. In addition, by employing the placement and structure of the contact points as described above, the aperture ratio can be increased and the element layer such as the emissive layer can be formed on a flat surface, and a more reliable element can be obtained.

DESCRIPTION OF PREFERRED EMBODIMENTS

Figure 1:
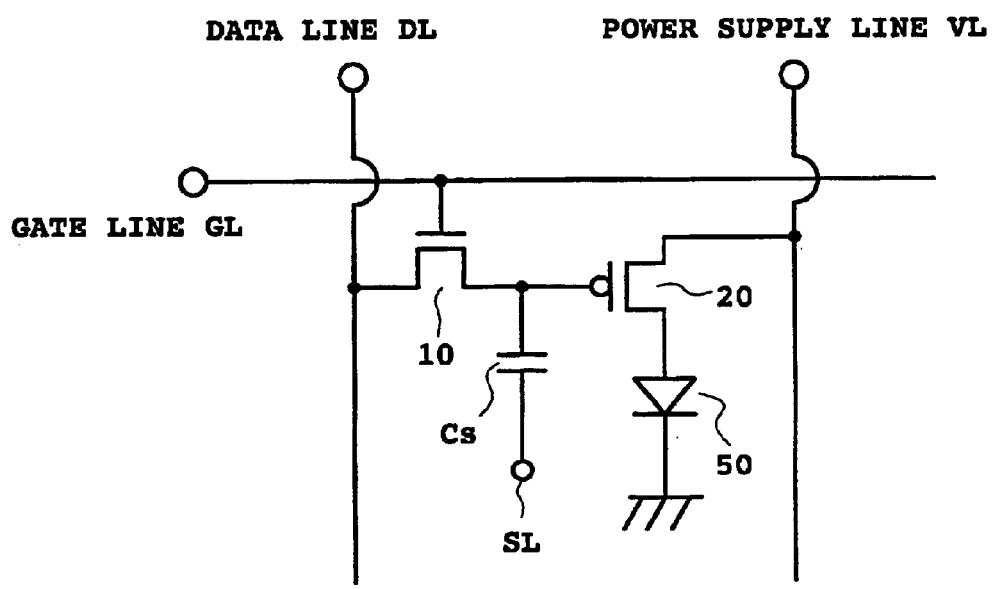
FIG. 1 is a diagram showing a circuit structure for one pixel in an active matrix type organic EL display device.

Preferred embodiments of the present invention (hereinafter referred to simply as embodiments) will now be described referring to the drawings.

First Embodiment

Figure 2:
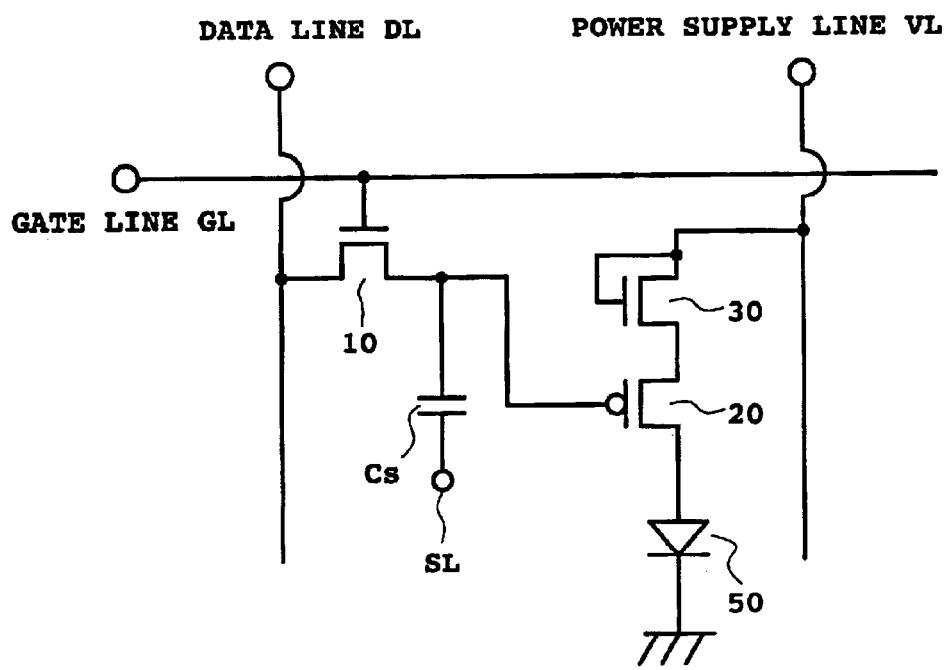
FIG. 2 is a diagram showing an example circuit structure of one pixel in an active matrix type organic EL display device according to a first embodiment of the invention.

FIG. 2 shows a circuit structure of one pixel in an active matrix type EL display device having m rows and n columns according to a first embodiment of the present invention. As shown in FIG. 2, each pixel comprises an organic EL element 50, a switching TFT (first TFT) 10, an element driving TFT (second TFT) 20, and an storage capacitor Cs, and is constructed in a region surrounded by a gate line GL extending in the row direction and a data line DL extending in the column direction. In the first embodiment, a compensation TFT 30 having the conductive characteristic opposite of that of the second TFT 20 is provided between the power supply line VL and the second TFT 20. The gate and either the source or the drain of the compensation TFT 30 are connected to provide a diode connection. The diode is connected in the forward direction between the power supply line VL and the second TFT 20. Thus, the compensation TFT can be operated without supplying any designated control signal.

The first TFT 10 is turned on by receiving a gate signal at its gate. When the first TFT 10 is turned on, the data signal supplied to the data line DL is held at the storage capacitor Cs connected between the first and second TFTs 10 and 20, and the potential at one electrode of the storage capacitor Cs becomes equal to the data signal. The second TFT 20 is provided between the power supply line VL and the organic EL element (the anode of the element) 50, and operates to supply a current corresponding to the voltage value of the data signal applied to its gate, from the power supply line VL to the organic EL element 50. In the example shown in FIG. 2, an nch-TFT which is capable of high-speed response is used for the first TFT 10 and a pch-TFT is used for the second TFT 20.

An nch-TFT having a polarity opposite that of the second TFT 20 is used for the compensation TFT 30. When the I-V (current-voltage) characteristic of the second TFT 20 is varied, the I-V characteristic of the compensation TFT 30 is varied in the opposite direction, thus compensating for the characteristic variation of the second TFT 20.

Figure 3:
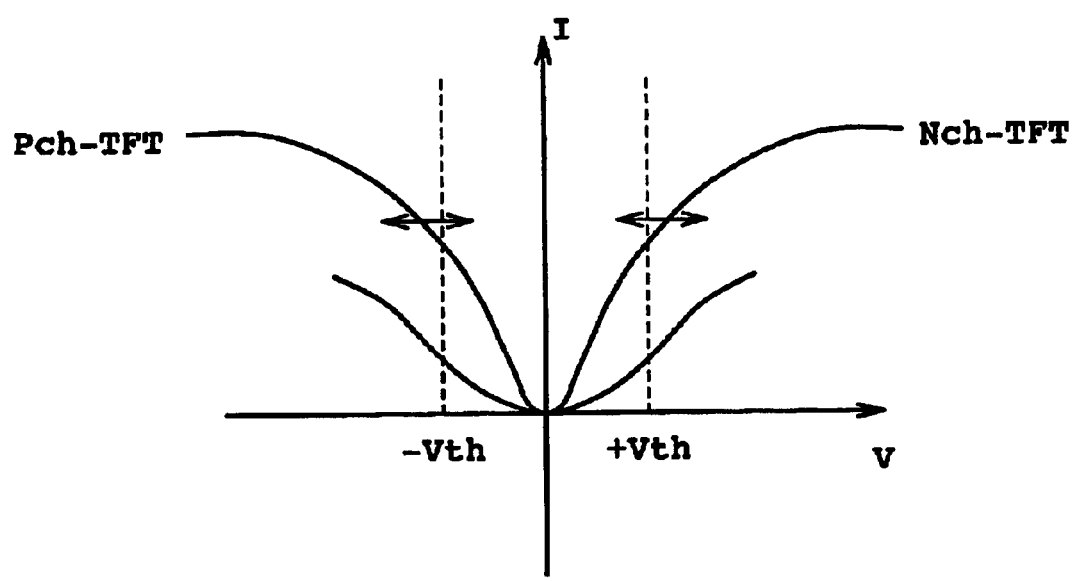
FIG. 3 is a diagram showing the I-V characteristic of a TFT.

FIG. 3 shows I-V characteristics of an nch-TFT and a pch-TFT which use polycrystalline silicon for the active layer. In the nch-TFT, when the voltage applied to the gate exceeds a predetermined positive voltage (+Vth), the current value is rapidly increased. In the pch-TFT, on the other hand, when the voltage applied to the gate becomes less than a predetermined negative voltage (-Vth), the current value is rapidly increased. In an nch-TFT and a pch-TFT formed on the same substrate, for example, when the threshold value, +Vth, of the nch-TFT is varied by an increase, that is, shifted to the right in FIG. 3, the threshold value, -Vth, of the pch-TFT is shifted by about the same degree to the right of FIG. 3. In contrast, when the threshold value, +Vth, of the nch-TFT is shifted to the left, the threshold value, -Vth, of the pch-TFT is also shifted to the left. For example, due to a variation in the manufacturing condition or the like, when -Vth of the pch-TFT used for the second TFT 20 of FIG. 2 is shifted to the right, in a conventional device, the amount of current supplied to the organic EL element 50 under the same condition would immediately be reduced. However, according to the first embodiment, the amount of current flowing from the compensation TFT 30, which is provided between the second TFT 20 and the power supply line VL and which is constructed from an nch-TFT, is increased.

According to the first embodiment, as shown in FIG. 2, a second TFT 20 and a compensation TFT 30 of opposite polarity are provided between the power supply line VL and the organic EL element 50. The two TFTs are thus balanced. That is, the amounts of current flowing from these TFTs always compensate for each other. In the circuit structure of the first embodiment, due to the presence of the compensation TFT 30, the maximum current value which can be supplied to the organic RL element 50 is less than that in the conventional circuit structure shown in FIG. 1 which does not have the compensation TFT 30. However, because the identification sensitivity of human eyes at a high brightness is significantly lower than that at an intermediate brightness, a small reduction in the maximum current value which can be supplied does not significantly influence the display quality. On the other hand, because the second TFT 20 and the compensation TFT 30 adjust the current flowing from each other in each pixel, the variation in the amount of current supplied to the organic EL element 50 among the pixels can be reduced.

Figure 4A:
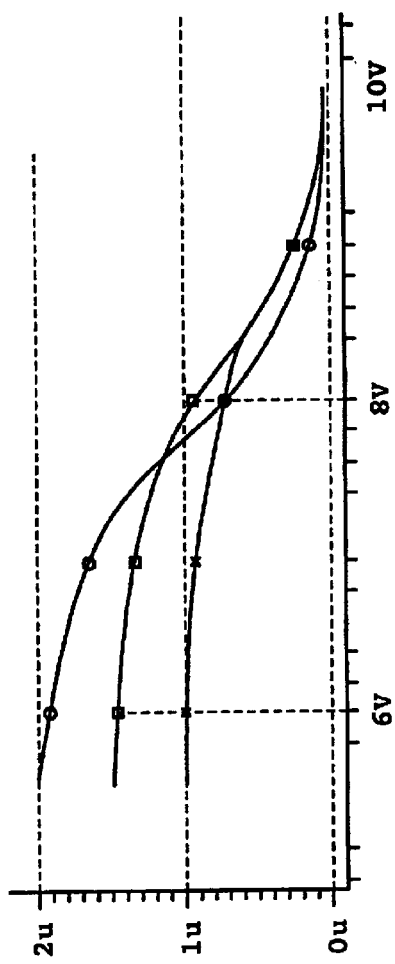
FIGS. 4A and 4B are diagrams showing the effects obtained by the circuit structure of the present invention and by a circuit of conventional structure.
Figure 4B:
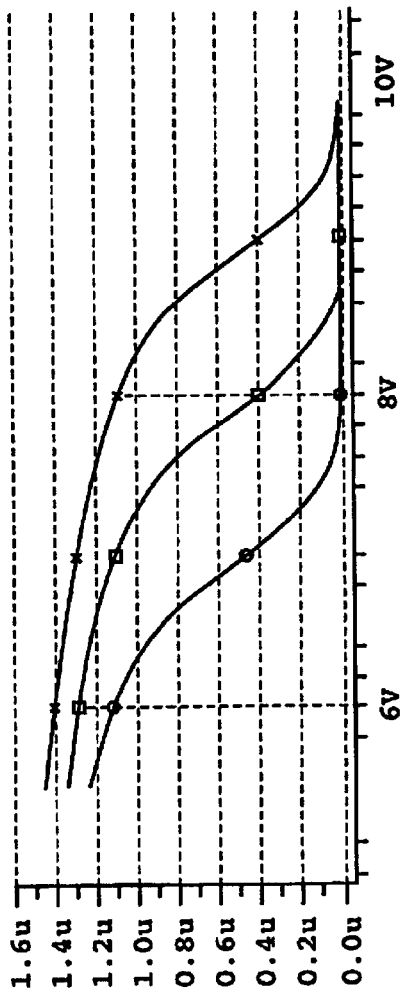

Now referring to FIGS. 4A and 4B, an advantage obtained by the circuit structure of the first embodiment will be described. FIG. 4A shows the relationship between the applied voltage (data signal) and the illumination brightness for an example case where the organic EL element is illuminated by the pixel circuit structure of the first embodiment shown in FIG. 2. Similarly, FIG. 4B shows the relationship between the applied voltage (data signal) and the illumination brightness for an example case wherein the organic EL element is illuminated by the conventional pixel circuit structure shown in FIG. 1. The setting in both FIGS. 4A and 4B is such that the requested maximum brightness with respect to the organic EL element occurs at the applied voltage (data signal) of 8V, and the gradation display is performed at an applied voltage between 8V and 10V. The three samples in FIGS. 4A and 4B respectively indicate illumination brightness characteristics for cases wherein organic EL panels having circuit structure respectively of FIG. 2 and FIG. 1 are formed under different manufacturing conditions. In other words, these samples indicate illumination brightness characteristics for cases where the characteristic of the TFT in the pixel section is deliberately varied.

As is clear from FIGS. 4A and 4B, with the conventional circuit structure, the brightness (luminance) characteristics for the three samples having different characteristics for TFT in the pixel section significantly differ from each other at the set voltage range for data signals between 8V and 10V. In contrast, with the circuit structure according to the first embodiment, although the characteristics differ from each other at the high-brightness region to which human eyes are insensitive, the brightness characteristic difference among the three samples at the intermediate-brightness region is very small. Therefore, by employing a circuit structure as described in the first embodiment for each pixel, even when the characteristic of the TFT is varied, in particular, even when the characteristic of the EL element driving TFT 20 which has a large influence is varied, the variation can be compensated by the compensation TFT 30 of an opposite polarity, thus enabling inhibition of the variation in the illumination brightness of the organic EL element.

Figure 5:
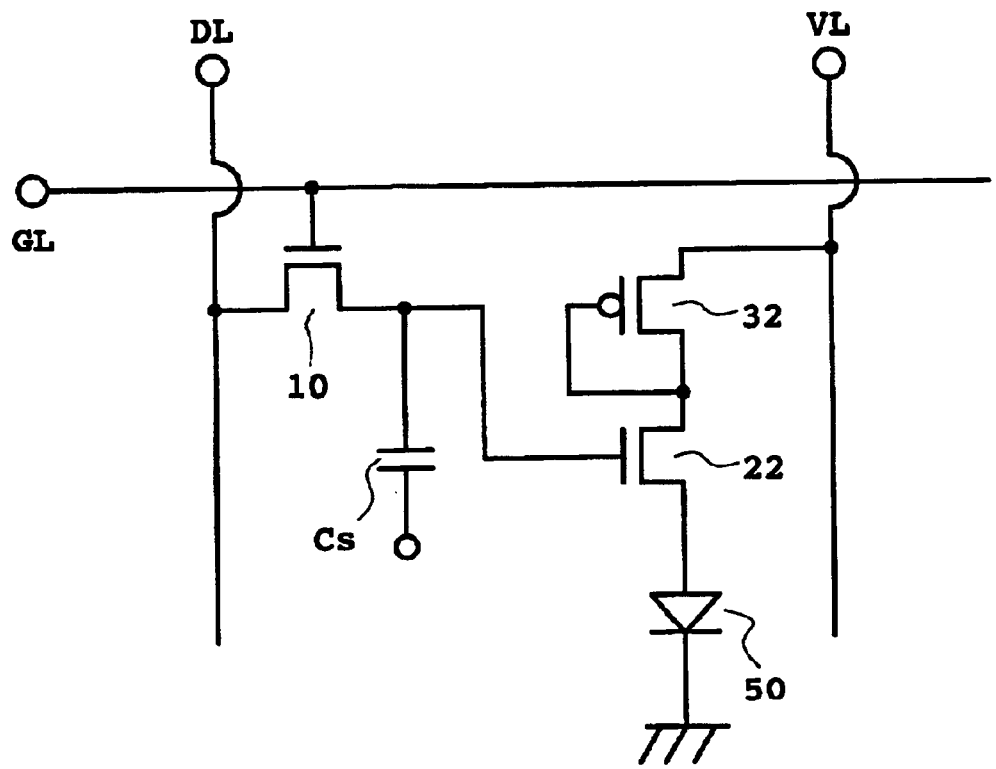
FIG. 5 is a diagram showing another circuit structure of one pixel in an active matrix type organic EL display device according to the first embodiment of the invention.

FIG. 5 shows another example circuit structure according to the first embodiment. The circuit structure of FIG. 5 differs from that of FIG. 2 in that the second TFT 22 is constructed using an nch-TFT and the compensation TFT 32 is constructed using a diode connected pch-TFT. Similar to the above structure, with this structure, the variation in characteristic of the second TFT 22 can be compensated by the compensation TFT 32.

Figure 6:
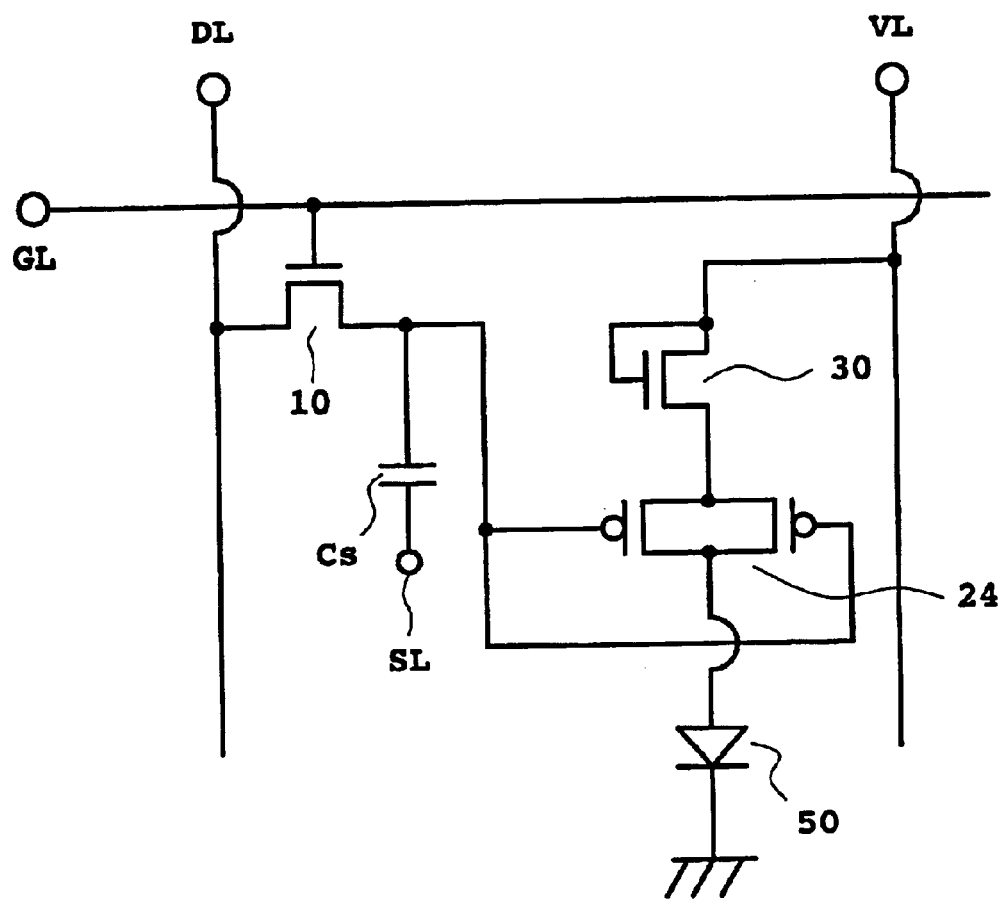
FIG. 6 is a diagram showing yet another circuit structure of one pixel in an active matrix type organic EL display device according to the first embodiment of the invention.

FIG. 6 shows yet another example of a circuit structure according to the first embodiment. The circuit structure of FIG. 6 differs from that of FIG. 2 in that a plurality of second TFTs are provided in parallel between the compensation TFT 30 and the organic EL element 50. The polarity of the TFTs are identical to that in FIG. 2, that is, the second TFTs 24 are of pch and the compensation TFT 30 is of nch. The gates of two second TFTs 24 are both connected to the first TFT 10 and to the first electrode of the storage capacitor Cs. Each of the sources is connected to the compensation TFT 30 and each of the drains is connected to the organic EL element 50. In this manner, by providing a plurality of the second TFTs 24 in parallel, it is possible to further reduce the variation in the current supplied to the organic EL element due to the characteristic variation of the second TFT.

If the target current value for each of the two second TFTs 24 is assumed to be i, the total target current value for the two second TFTs 24 would be 2i. Even when the current supply capability for one of the second TFTs 24 is reduced to i/2 due to, for example, variations, the other second TFT 24 can continue to flow a current of i, and a total current of (3/2)i can be supplied to the organic EL element, where the target value is 2i. In the worst case, if the current supply capability of one of the TFTs becomes 0, a current of i can be supplied to the organic EL element by the other TFT in the example shown in FIG. 6. The advantage of such a structure can be readily seen when one considers a case wherein the current supply capability becomes 0 in a circuit having single second TFT 24 and the pixel becomes deficient.

Each TFT in the first embodiment is obtained by polycrystallizing an a-Si by a laser annealing process. When a plurality of second TFTs 24 are provided in parallel, it is easy to arrange the positions of the second TFTs 24 so that the laser is not simultaneously irradiated to active layers of both second TFTs 24 by, for example, shifting the formation positions with respect to the laser scan direction. By arranging the second TFTs 24 in this manner, the probability that all second TFTs 24 become deficient can be significantly reduced, and thus, characteristic variation caused by the laser annealing can be minimized. In addition, as described above, because a compensation TFT 30 is provided between the second TFTs 24 and the power supply line VL, even when there is a shift in the threshold value of the second TFTs 24 due to the variations in conditions such as, for example, annealing condition, the shift can be alleviated by the compensation TFT 30.

Figure 7:
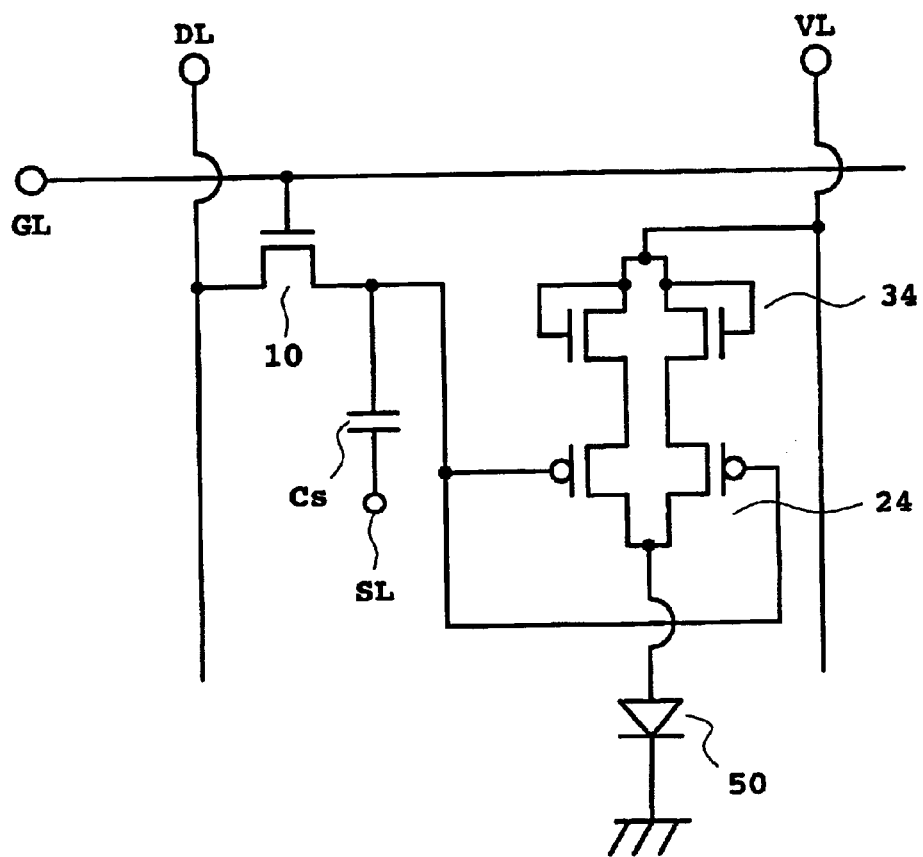
FIG. 7 is a diagram showing still another circuit structure of one pixel in an active matrix type organic EL display device according to the first embodiment of the invention.

FIG. 7 shows a further example pixel circuit structure according to the first embodiment. This circuit structure differs from that shown in FIG. 6 in that not only are the second TFTs 24 provided in plurality, but that the compensation TFTs are also provided in plurality. Each compensation TFT 34 is provided between the power supply line VL and the second TFTs 24. As shown in FIG. 7, by providing a plurality of compensation TFTs 34, variations in the current supply capability generated among the compensation TFTs 34 can be alleviated and, thus, reliability of reduction in variation in current supply capability to the organic EL element 50 can be enhanced.

Figure 8:
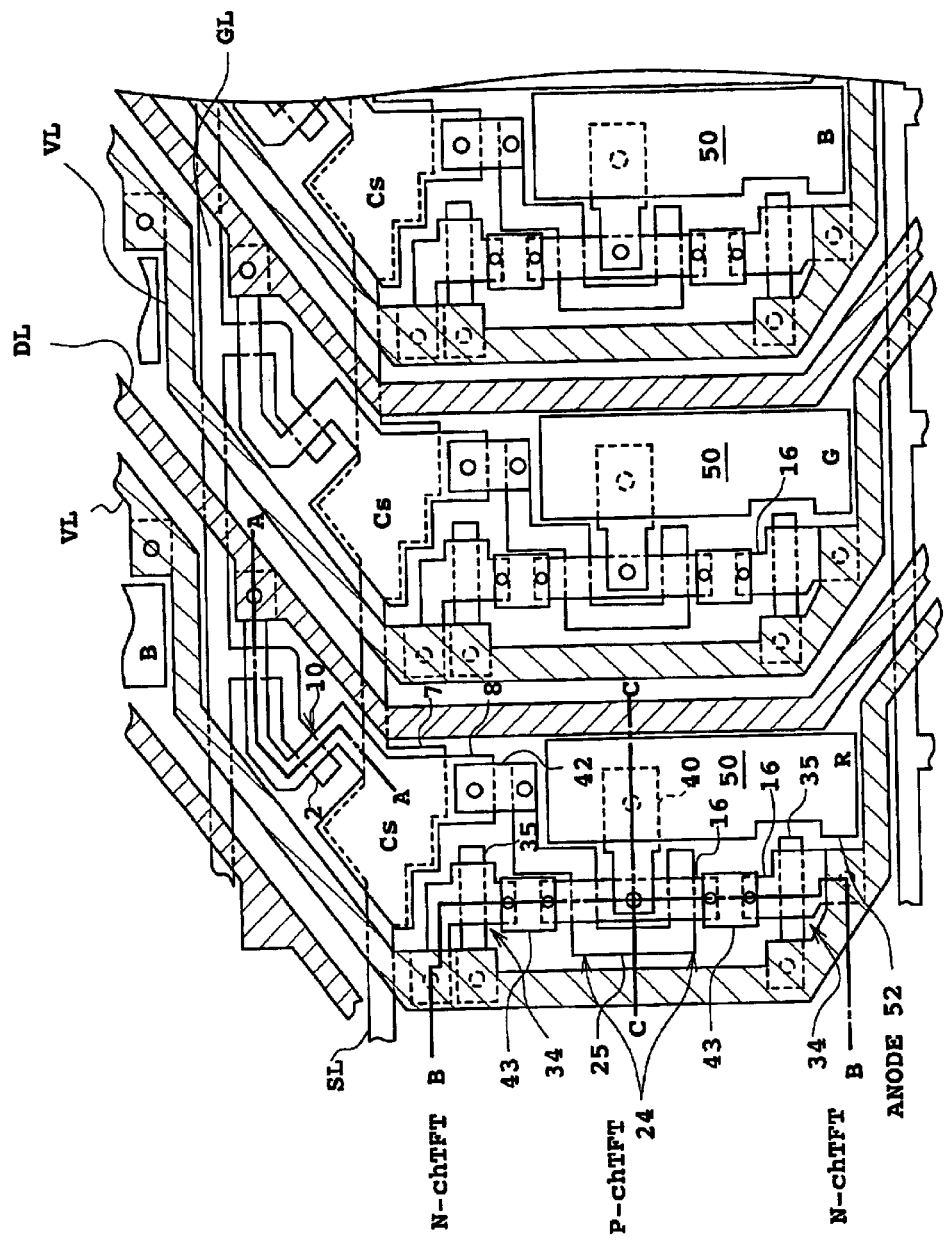
FIG. 8 is a diagram showing planer structure of the active matrix type organic EL panel according to the first embodiment of the present invention with the circuit structure shown in FIG. 7.
Figure 9A:
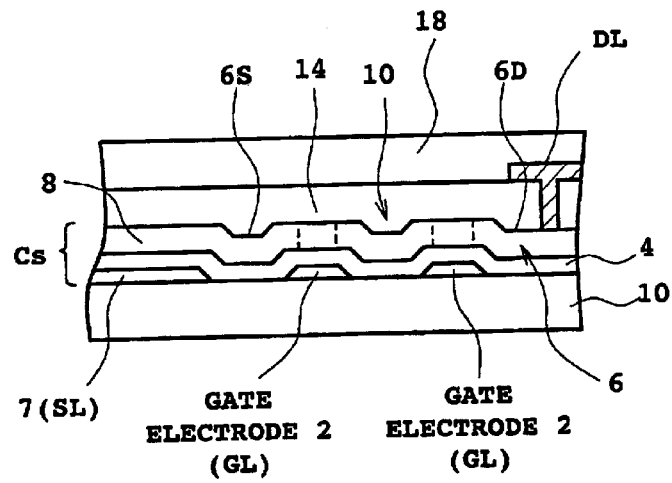
FIGS. 9A, 9B, and 9C are diagrams respectively showing the cross sectional structure along the lines A—A, B—B, and C—C of FIG. 8.
Figure 9B:
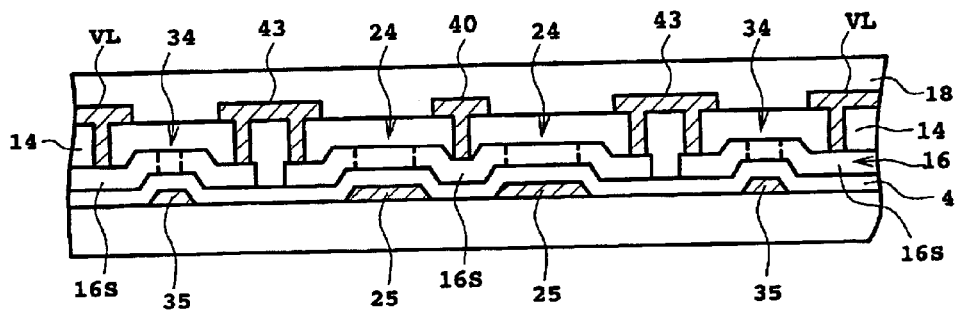
Figure 9C:
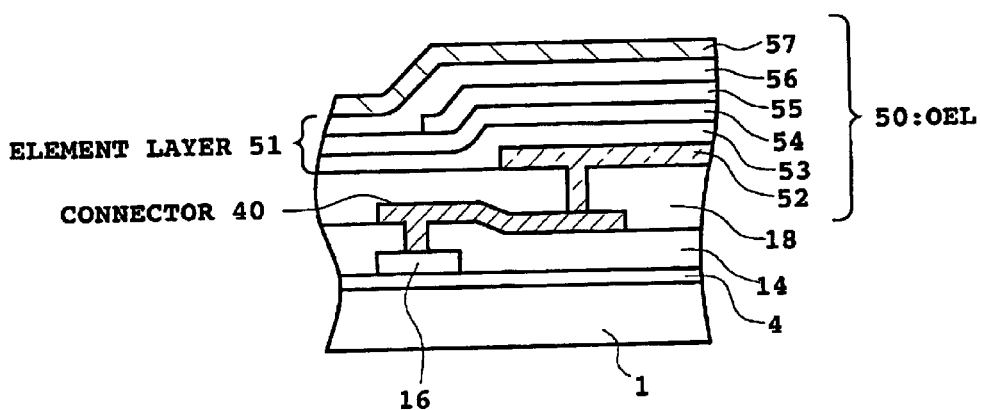

FIG. 8 shows one example of the planer structure of the organic EL display device having a circuit structure shown in FIG. 7. FIG. 9A is a schematic cross section along the A—A line in FIG. 8, FIG. 9B is a schematic cross section along the B—B line in FIG. 8, and FIG. 9C is a schematic cross section along the C—C line in FIG. 8. In FIGS. 9A through 9C, the layers (films) that are simultaneously formed are assigned the same reference numeral except where their functions are different.

As shown in FIG. 8, each pixel includes a first TFT 10, a storage capacitor Cs, two pch-second TFTs 24, two nch-compensation TFTs 34 which are diode-connected between the power supply line VL and the second TFTs 24, and an organic EL element 50 connected to the drains of the second TFTs 24. In the example of FIG. 8, although the configuration is not limited to the one shown, a pixel is placed in the region surrounded by a gate line GL extending in the row direction and a power supply line VL and a data line DL both extending in the column direction. Also in the example of FIG. 8, delta arrangement is employed for realizing a more high resolution color display device wherein the positions for R, G, and B pixels are shifted at each row, and consequently, the data line DL and the power supply line VL are not straight, but extend in the column direction through the gap between pixels having positions shifted for each row.

In each of the pixel regions, the first TFT 10 is formed near the cross section between the gate line GL and data line DL. As an active layer 6, p-Si obtained by polycrystallizing a-Si by a laser annealing process is used. The active layer 6 has a pattern where it steps over twice the gate electrode 2 which protrudes from the gate line GL. Although a single gate structure is shown in FIG. 7, in the circuit, a dual gate structure is employed. The active layer 6 is formed on a gate insulation film 4 which is formed to cover the gate electrode 2. The sections of the active layer 6 immediately above the gate electrodes 2 form channels and source region 6S and drain region 6D to which an impurity is doped are formed around the channels. Because it is desirable that the first TFT 10 responds quickly to the selection signal output on the gate line GL, impurity such as phosphorous (P) is doped into the source region 6S and the drain region 6D, to form an nch-TFT.

The drain region 6D of the first TFT 10 is connected, via a contact hole opened in an interlayer insulation film 14 formed to cover the entire first TFT 10, to the data line DL formed on top of the interlayer insulation film 14.

The source region 6S of the first TFT 10 is connected to the storage capacitor Cs. The storage capacitor Cs is formed in the region where a first electrode 7 and a second electrode 8 are overlapped with the gate insulation film 4 in between. The first electrode 7 extends in the row direction in FIG. 8, similar to the gate line GL, and is formed integrally with a capacitor line SL formed from the same material as the gate. The second electrode 8 is integral with the active layer (semiconductor layer) 6 of the first TFT 10 and is constructed by the active layer 6 extending to the formation position of the first electrode 7. The second electrode 8 is connected to the gate electrodes 25 of the second TFTs 24 via a connector 42.

The cross sectional structures for the two pch-second TFTs 24 and the two nch-compensation TFTs 34 are shown in FIG. 9B. The second TFTs 24 and the compensation TFTs 34 use a semiconductor layer 16 patterned in an island-like manner for each TFT in the direction along the data line DL (power supply line VL), as an active layer. Therefore, in this example, the channels of the second TFTs 24 and of the compensation TFTs 34 are arranged so that the channel length direction is along the data line DL, that is, along the longitudinal direction of the pixel having an elongated shape. The semiconductor layer 16 is simultaneously formed with the active layer 6 of the first TFT 10, and a polycrystalline silicon formed by polycrystallizing a-Si by a laser annealing process is used as the semiconductor layer 16.

The compensation TFTs 34 placed at both ends of FIG. 9B are connected at their respective drain region to the same power supply line VL via a contact hole opened in the interlayer insulation film 14. A gate electrode 35 is provided immediately below the channel region of the compensation TFT 34 with the gate insulation film 4 in between. The gate electrode 35 is a layer formed by the same material as and simultaneously with the gate line GL, and is connected to the power supply line VL at a contact hole, as shown in FIG. 8. Therefore, the compensation TFTs 34 construct diodes in which both gates and drains are connected to the power supply line VL, as shown in the circuit diagram of FIG. 7. The source region of each compensation TFT 34 is provided to be distant from the source region of the second TFT 24 constructed from a pch-TFT, and is connected to the source region of the second TFT 24 by a contact wiring 43.

Similar to the gate electrode 35 of the compensation TFTs 34, each gate electrode 25 of the second TFTs 24 is a conductive layer formed from the same material as and simultaneously with the gate line GL. The conductive layer is connected to the second electrode 8 of the storage capacitor Cs via the connector 42, extends from the formation region of the storage capacitor Cs along the power supply line VL, extends further under the active layer 16, and forms each of the gate electrodes 25 of the two second TFTs 24.

The organic EL element 50 has a cross sectional structure as shown in, for example, FIG. 9C, and is formed on top of a flattening insulation layer 18 provided over entire substrate for flattening the upper surface after each of the TFTs are formed as described above. The organic EL element 50 is constructed by laminating an organic layer between an anode (transparent electrode) 52 and a cathode (metal electrode) 57 formed at the uppermost layer and common to all pixels. Here, the anode 52 and the source region of the second TFT 24 are not directly connected, but are connected via a connector 40 which constructs a wiring layer.

In the first embodiment, as shown in FIG. 8, two second TFTs 24 are both connected to a connector 40 and the connector 40 contacts the first electrode 52 of the organic EL element 50 at one contact point. In other words, the organic EL element 50 is connected to n second TFTs 24 at contact points having the number equal to or smaller than (n−1). Because the contact region sometimes become a non-illuminating region, by minimizing the number of contact points between the organic EL element 50 and the connector 40 (second TFTs 24), it is possible to maximize the illumination region. Another example related to the number of contacts will be described later as a third embodiment.

In the first embodiment, as shown in FIGS. 8 and 9C, the connection position between the connector 40 and the anode 52 is arranged so that it is shifted from the connection position between the connector 40 and the second TFTs 24. In the emissive element layer 51 which will be described later and which includes an organic compound, electric field concentration tends to occur at a locally thin region, and degradation may be caused from the region where electric field concentration occurred. Therefore, it is desirable that the formation region of the emissive element layer 51 in which an organic material is used be as flat as possible. In the upper layer of a contact hole, a recess due to the contact hole is produced, and the depth of the recess becomes larger as the contact hole becomes deeper. Therefore, by placing the contact hole for connecting the connector 40 and the source region of the second TFTs 24 at a region outside the formation region of the anode 52, it is possible to make the upper surface of the anode 52 onto which an organic layer is formed as flat as possible. An example for flattening the upper surface of the anode 52 will be described later to illustrate a fourth embodiment of the present invention.

The emissive element layer (organic layer) 51 comprises, from the side of the anode, for example, a first hole transport layer 53, a second hole transport layer 54, an organic emissive layer 55, and an electron transport layer 56 laminated in that order. As an example, the first hole transport layer 52 includes MTDATA: 4,4',4"-tris(3-methylphenylphenylamino)triphenylamine, the second hole transport layer 54 includes TPD: N,N'-diphenyl-N,N'-di(3-methylphenyl)-1,1'-biphenyl-4,4'-diamine, the organic emissive layer 55 includes, although dependent on the target illumination color of R, G, and B, for example, BeBq$_2$: bis(10-hydroxybenzo[h]quinolinato)beryllium which includes quinacridone derivative, and the electron transport layer 56 is constructed from BeBq. In the example of the organic EL element 50 shown in FIG. 9C, the layers (53, 54, 56, and 57) other than the anode 52 constructed from an ITO (indium Tin Oxide) or the like and the organic emissive layer 55 are formed to be common to every pixel. Another example of the structure of the EL element can be constructed by sequentially laminating the layers of (a) transparent layer (anode); (b) a hole transport layer constructed from NBP; (c) an emissive layer including red (R) constructed by doping a red dopant (DCJTB) into a host material (Alq$_3$), green (G) constructed by doping a green dopant (coumarin 6) into a host material (Alq$_3$), and blue (B) constructed by doping a blue dopant (perylene) into a host material (BAlq); (d) an electron transport layer constructed from Alq$_3$; (e) an electron injection layer constructed from lithium fluoride (LiF); and (f) electrode (cathode) constructed from Aluminum (Al). The official names of the above materials described in abbreviations are as follows:

"NBP": N,N'-Di((naphthalene-1-yl)-N,N'-diphenyl-benzidine);
"Alq$_3$": Tris(8-hydroxyquinolinato)aluminum;
"DCJTB": (2-(1,1-Dimethlethyl)-6-(2-(2,3,6,7-tetrahydro-1,1,7,7-tetramethyl-1H,5H-benzo[ij]quinolizin-9-yl) ethenyl)-4H-pyran4-ylidene)propanedinitrile;
"coumarin 6": 3-(2-Benzothiazolyl)-7-(diethylamino) coumarin; and
"BAlq": (1,1'-Bisphenyl-4-Olato)bis(2-methyl-8-quinolinplate-N1,08)Aluminum.

The present invention, however, is not limited to these configurations.

In a pixel having the structure as described above, when a selection signal is applied to the gate line GL, the first TFT 10 is turned on. The potential of the data line DL and the potential of the source region of the first TFT 10 connected to the second electrode 8 of the storage capacitor Cs become equal to each other. A voltage corresponding to the data signal is supplied to the gate electrode 25 of the second TFT 24, and the second TFT 24 supplies, depending on the voltage value, a current to the anode 52 of the organic EL element 50, which is supplied from the power supply line VL via the compensation TFT 34. With this operation, a current based on the data signal can be accurately supplied to the organic EL element 50 for each pixel and, thus, uniform display without variation can be achieved.

As shown in FIG. 8, because a plurality of (in this example, two) compensation TFTs 34 and second TFTs 24 are provided between the power supply line VL and the organic EL element 50 in that order, when a characteristic shift or deficiency is generated at one of these TFTs due to a variation, the variation in the supplied amount of current, which is determined by the total of the plurality of groups, is alleviated due to the presence of the other TFT having normal characteristics.

In the planer placement shown in FIG. 8, a polycrystalline silicon layer produced by polycrystallization by laser annealing process is used as the active layers. The annealing process may be performed, for example, by scanning a laser beam which is longer in the row direction of the figure, in the column direction. Even in such a case, the channel direction of the first TFT 10 and the length channel direction of the active layers of each of the second and compensation TFTs 24 and 34 do not coincide, and the formation positions for the first and second TFTs 10 and 24 are far apart. Therefore, it is possible to prevent simultaneous generation of failures in the first and second TFTs 10 and 24 and in the second and compensation TFTs 24 and 34 by the laser annealing.

In the above, all of the first TFT 10, second TFTs 24, and compensation TFTs 34 are described as a bottom gate structure, but these TFTs can have a top gate structure wherein the gate electrode is formed on an upper layer than the active layer.

As described above, according to the first embodiment, it is possible to alleviate variations in characteristic of the transistor for supplying power to an element to be driven such as an organic EL element and, thus, it is possible to average the variation in the supplied power to the element to be driven and to prevent variations in illumination brightness (luminance) or the like at the element to be driven.

Second Embodiment

Figure 10A:
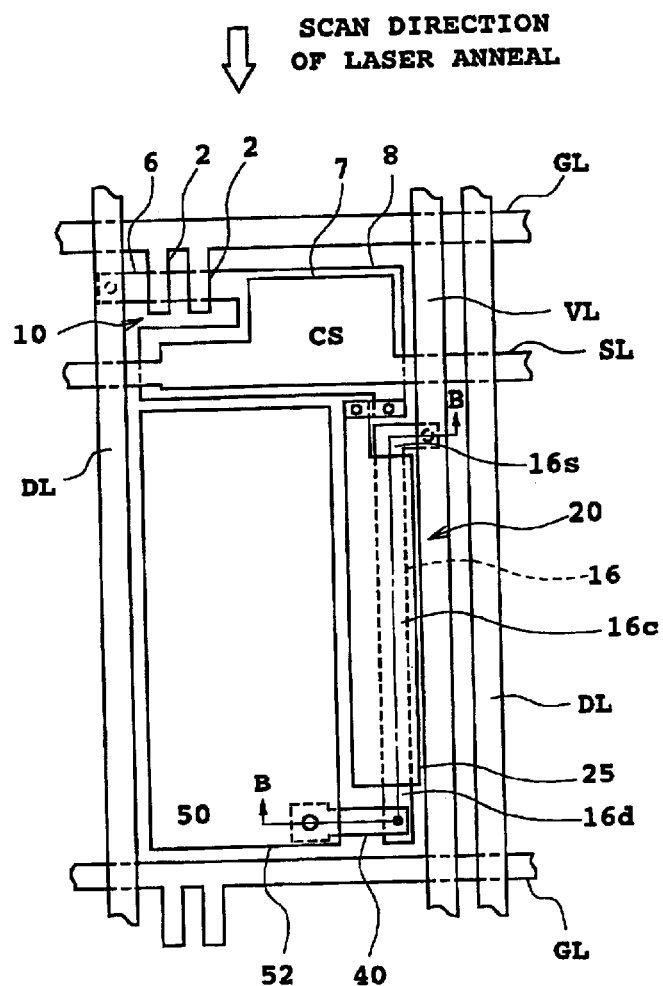
FIGS. 10A and 10B are respectively a planer diagram and a cross sectional diagram of one pixel of the active matrix type organic EL panel according to a second embodiment of the present invention.
Figure 10B:
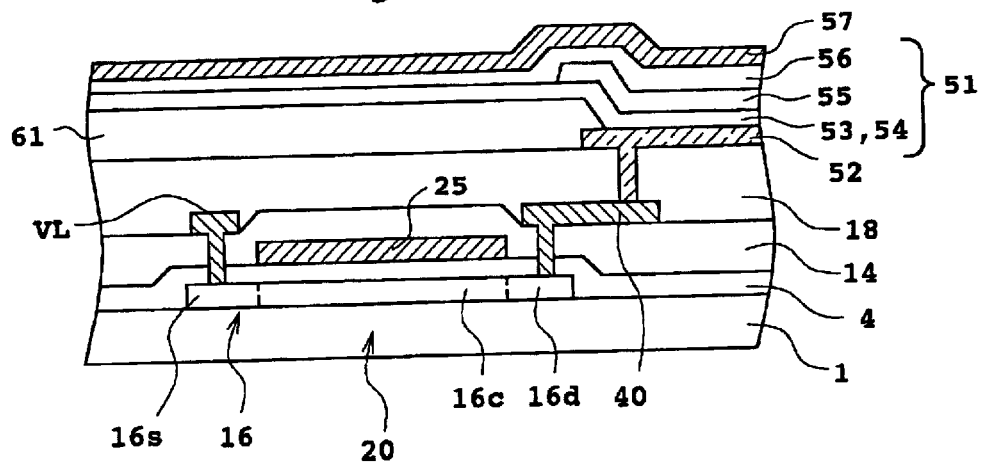

A second embodiment of the present invention will now be described. In the first embodiment, in order to prevent variation in the illumination brightness among pixels as a result of characteristic variations in the transistor, a compensation thin film transistor having an opposite conductive characteristic as the element driving thin film transistor is provided. In contrast, in the second embodiment, the variation in the illumination brightness among pixels is inhibited by considering the placement of the element driving thin film transistor (second TFT). FIGS. 10A and 10B show an example configuration of one pixel according to the second embodiment. FIG. 10A is a schematic planer view and FIG. 10B is a cross sectional view along the B—B line in FIG. 10A. This structure is shown with the same circuit structure as that of FIG. 1. In these figures, the components corresponding to those in the drawings that are already explained will be referred to by the same reference numerals.

In the second embodiment, one pixel comprises an organic EL element 50, a first TFT (switching thin film transistor) 10, a storage capacitor Cs, and a second TFT (element driving thin film transistor) 20. In contrast to the first embodiment, a single second TFT 20 is formed between the power supply line VL and the organic EL element 50, and the second TFT 20 is placed so that its channel length direction is along the longitudinal direction of the pixel formed in an elongated shape, similar to the configuration shown in FIG. 8. In the second embodiment, by arranging the second TFT 20 so that the channel length direction is along the longitudinal direction of the pixel region, the illumination region of the organic element 50 can be maximized, and, at the same time, the necessary TFT can be efficiently placed in one pixel region which has a limited area, even in the case where a second TFT 20 having a long channel length is to be placed or in the case where a second TFT 20 and a compensation TFT 30 must be placed between the power supply line VL and the organic EL element 50 as shown in FIG. 8.

In the second embodiment, by placing the second TFT 20 in the longitudinal direction of the pixel, the channel length of the second TFT 20 can be lengthened to a sufficient length, as shown in FIGS. 10A and 10B. By lengthening the channel length of the second TFT 20 to a sufficient length, the reliability can be improved because the durability of the TFT is improved. Moreover, this configuration enables averaging of the transistor characteristic of the second TFT 20, and, thus enables reduction in variations in the current supply capability of the second TFT 20 among pixels. The reduction of capability variation then allows for significant reduction of the variation in the illumination brightness of the organic EL element 50 caused by such a capability variation.

In the second embodiment, the second TFT 20 uses a polycrystalline silicon layer obtained by polycrystallizing an amorphous silicon layer by laser annealing as the semiconductor layer (active layer) 16, similar as in the first embodiment. In this case, by setting the scan direction of the laser annealing to coincide with the channel length direction of the second TFT 20, that is, by placing the irradiating region of the pulse laser so that the edge in the longitudinal direction crosses in the width direction of the channel 16c and by lengthening the channel length of the second TFT 20 as described above, the characteristics variation in the second TFT 20 can be reduced because it is easy to adjust the laser so that the entire channel region of the second TFT 20 is not annealed by a single laser shot, and because generation of a large difference in the characteristic of the second TFT 20 among other pixels can be prevented. Thus, it is possible to obtain even higher averaging effect on the characteristic of the second TFT 20.

It is desired that the second TFT 20 supplies a relatively large current from the driving power supply (power supply line VL) to the organic EL element 50. When a p-Si TFT which uses polycrystalline silicon for the active layer 16 is used for the second TFT 20, the mobility of p-Si is sufficient with respect to the desired capability, and, thus, the second TFT 20 can achieve sufficient current supply capability even when the channel length is designed to be lengthened. Because the second TFT 20 is directly connected to the power supply line VL, the required durability is high, and consequently, it is often desired that the channel length CL be longer than the channel width. Thus, in addition to the above viewpoint, it is desirable that the channel length of the second TFT 20 be lengthened to a sufficient length. By forming the second TFT 20 so that the channel length direction is along the longitudinal direction of the pixel region, the second TFT 20 with a long channel can be efficiently placed within one pixel region.

In a display device constructed by arranging a plurality of pixels on the display surface in a matrix form, the shape of each of the pixels tends to be designed to have a shape that is longer in the column direction as shown in FIGS. 8 and 10A. In such a case, by placing the second TFT 20 so that the channel length direction is along the column direction, the channel length would be along the longitudinal direction of the pixel region, and thus, the desired channel length as described above can be easily secured.

As shown in the second embodiment, in an active matrix type display device wherein a switching element is provided in each pixel for driving the display element, a data line DL for supplying a data signal to the first TFT 10 is provided in the column direction and a selection line (gate line) GL is provided in the row direction. By placing the second TFT 20 so that its channel length direction is along the extension direction of the data line DL (column direction), efficient placement of the second TFT 20 within the pixel region while securing a long channel length can be facilitated. In the example shown in FIGS. 10A and 10B, a layout wherein the power is supplied from a driving power supply Pvdd to each pixel by the power supply line VL is employed. Because the power supply line VL also extends in the column direction similar to the data line, the channel length direction of the second TFT 20 also coincides with the extension direction of the power supply line VL.

In the second embodiment, as described above, the second TFT 20 is arranged so that its channel length direction coincides with the scan direction of the laser annealing or is parallel to the column direction (extension direction of the data line DL), but the first TFT 10 is placed so that its channel length direction coincides with the extension direction of the gate line GL, that is, the row direction. Thus, in the second embodiment, the first TFT 10 and the second TFT 20 have different channel length directions.

A cross sectional structure of the display device according to the second embodiment will now be described referring to FIG. 10B. FIG. 10B shows a cross sectional structure of the second TFT 20 and the organic EL element 50 which is connected to the second TFT 20. The first TFT 10, which is not shown, has a basic structure similar to that of the second TFT 20 shown in FIG. 10B, with the exceptions that the first TFT 10 has a different channel length, a double gate structure, and a different conductive type for the active layer 6.

The first TFT and second TFT shown in the first embodiment both have a bottom gate structure, but the first TFT 10 and the second TFT 20 of the second embodiment have a top gate structure wherein the gate electrode is formed on an upper layer than the active layer. The structure of the second embodiment is not limited to the top gate structure, and a bottom gate structure may also be employed.

The active layer 16 of the second TFT 20 and the active layer 6 of the first TFT 10 are both constructed from polycrystalline silicon obtained by laser annealing and polycrystallizing an amorphous silicon layer formed on a substrate 1, as described above. A gate insulation film 4 is formed on top of the active layers 6 and 16 constructed form polycrystalline silicon. Each of the gate electrodes 2 and 25 respectively of the first TFT 10 and of the second TFT 20 is formed on the gate insulation film 4. The gate electrode 25 of the second TFT 20 is connected to the second electrode 8 of the storage capacitor Cs which is integral with the active layer 6 of the first TFT 10. As shown in FIG. 10A, the gate electrode 25 is patterned so that it extends from the connection section with the storage capacitor Cs in the column direction and widely covers the section of the gate insulation film 4 above the active layer 16.

The region of the active layer 16 of the second TFT 20 which is covered by the gate electrode 25 at the top is the channel region 16c. A source region 16s and a drain region 16d are formed at both sides of the channel region 16c. In the second embodiment, the source region 16s of the active layer 16 is electrically connected to the power supply line VL near the storage capacitor Cs via a contact hole formed to penetrate through the gate insulation film 4 and the interlayer insulation film 14. The drain region 16d is connected to a connector (wiring layer) 40 near the gate line GL which corresponds to the next row of the matrix, via a contact hole formed to penetrate through the gate insulation film 4 and the interlayer insulation film 14. The connector 40 extends from the connection region with the drain region 16d to the formation region of the organic EL element 50, and is electrically connected to an ITO electrode (anode) 52 of the organic EL element 50 via a contact hole formed on a first flattening insulation layer (planarizating insulation layer) 18 which is formed to cover the interlayer insulation film 14, power supply line VL, and connector 40.

In FIG. 10B, only the central region of formation of the anode 52 of the organic EL element is opened above the first flattening layer 18. A second flattening (planarizating) insulation layer 61 is formed to cover the edge of the anode 52, wiring region, and the formation regions for the first and second TFTs. The emissive element layer 51 of the organic EL element 50 is formed on the anode 52 and the second flattening insulation layer 61. A metal electrode 57 which is common to all pixels is formed on top of the emissive element layer 51.

The relationship between the channel length CL of the second TFT 20 and the moving pitch P of the laser will now be explained. As described above, it is desired that the channel length CL of the second TFT 20 be sufficiently long. In order to prevent annealing of the entire channel region by one pulse laser, it is preferable to set the moving pitch P of the laser and the channel length CL so that P<CL. In some cases, the moving pitch P is adjustable according to the setting of the optical assembly system of the laser annealing device or the like. In such a case, it is preferable that the device be adjusted so that CL>P. In a display device having a resolution of about 200 dpi, for example, even when the length in the pixel row direction is about 30 μm, about 80 μm can be secured in the column direction. Moreover, in a configuration wherein the moving pitch P of the laser is between 20 μm and 35 μm, by placing the second TFT 20 so that its channel length direction is along the pixel longitudinal direction, a length of 50 μm to 80 μm can be secured as the channel length CL, and thus, the above relationship can be satisfied. With such a relationship, the channel region 16c of the second TFT 20 is always polycrystallized by a plurality of pulse laser irradiations, and it is possible to reduce the difference in the characteristic from the second TFT 20 of other pixels which are similarly polycrystallized by a plurality of pulse laser irradiations.

Figure 11:
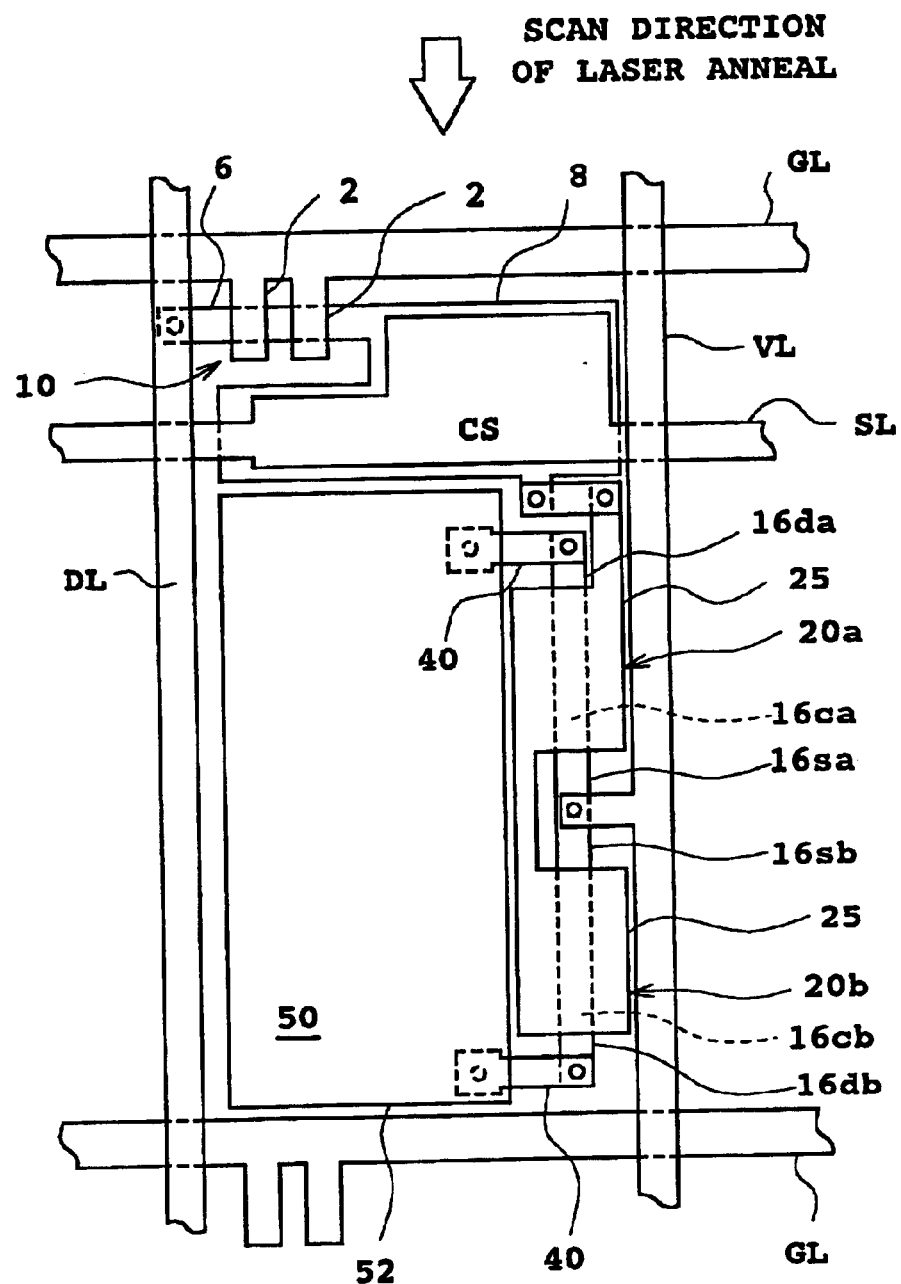
FIG. 11 shows another example of a planer structure of one pixel of the active matrix type organic EL panel according to the second embodiment.

In the above explanation, a single second TFT 20 is formed between the organic element 50 and the power supply line VL in one pixel. However, the second embodiment is not limited to such a configuration, and a plurality of second TFTs 20 may be provided in one pixel. FIG. 11 shows an example layout for a case wherein a plurality of second TFTs 20 are connected in parallel between the power supply line VL and the organic EL element 50. The equivalent circuit of the pixel structure shown in FIG. 11 is similar to the case where the compensation TFT 30 is removed from the circuit shown in FIG. 6. The source regions 16sa and 16sb of two second TFTs 20 are both connected to the power supply line VL and the drain regions 16da and 16db are both connected to the anode 52 of the organic EL element 50 via a contact 40 respectively. By providing a plurality of second TFTs 20 in one pixel in this manner, the probability that no current can be supplied to the organic EL element because both of the second TFTs 20 within one pixel simultaneously became deficient can be reduced, at least to ½ or less.

The placement of two second TFTs 20a and 20b is such that the channel length direction of the second TFTs 20a and 20b is approximately parallel to the longitudinal direction (in this case, this direction coincides with the extension direction of the data line DL) of the pixel region similar to FIG. 10A. With such a placement, it is possible to maximize the illumination region and, at the same time, to secure maximum length for each channel length CL. The scan direction of the laser anneal is set, even in FIG. 11, to be parallel to both channel length directions of the two second TFTs 20a and 20b. The active layers 16a and 16b are placed in a straight line. It is not necessary that the active layers for a plurality of second TFTs 20a and 20b be provided on a straight line, but because the channel regions 16ca and 16cb of the second TFTs 20a and 20b do not completely coincide with the laser scan direction and are somewhat shifted, it is possible to more reliably prevent the characteristics of the TFTs 20a and 20b to vary in the same manner. In other words, because the channel length direction is shifted from each other in the laser scan direction, the probability that the channel for the two TFTs are simultaneously annealed by the same pulse is reduced and, thus, the probability of a problem such as, for example, the characteristics of the second TFTs 20a and 20b being shifted from the set value in the same manner or simultaneous failure of both transistors can be significantly lowered. Therefore, the variation in the total amount of current supplied to the organic EL element 50 among the pixels can be reduced.

It is preferable that both channel lengths CLa and CLb of the two second TFTs 20a and 20b be greater than the moving pitch P of the laser, as described above. Moreover, it is preferable that the separation distance L between the channels 16ca and 16cb of the plurality of second TFTs 20a and 20b be greater than the moving pitch P of the laser. However, when a plurality of second TFTs 20 is provided in one pixel, as shown in FIG. 11, simultaneous failure in the plurality of transistors (TFT) 2a and 2b within a pixel or characteristic shift in the same manner can be prevented and, thus, the reduction effect in the characteristic variation among pixels can be achieved by at least setting the sum of the total channel length of the TFTs 20a and 20b and the separation distance L to be larger than the moving pitch P.

As described above, according to the second embodiment, it is possible to alleviate variations in characteristics of the transistor for supplying power to an element to be driven such as an organic EL element, and thus, it is possible to average the variation in the supplied power to the element to be driven and to prevent variations in illumination brightness or the like at the element to be driven.

Third Embodiment

A method for efficiently connecting a plurality of second TFTs 20 and corresponding organic EL element 50 within one pixel will now be described as a third embodiment of the present invention. As described in the first embodiment and as shown in FIG. 11 of the second embodiment, provision of a plurality of second TFTs 20 between an organic EL element 50 and a power supply line VL within one pixel is advantageous from the viewpoint of improvements in reliability, characteristic, or the like. In a case wherein a plurality of second TFTs 20 are provided within one pixel, as shown in FIG. 11, by respectively connecting the second TFTs 20a and 20b and the organic EL element 50, a current can more reliably be supplied from the power supply line VL to the organic EL element 50 via the second TFTs 20. However, in an organic EL element of the type shown in FIG. 10B in which light from the emissive layer 55 is emitted from a transparent anode 52 to the outside via the substrate 1 at the lower section, the contact section usually has a light blocking characteristic. For example, in FIGS. 9C and 10B, the connection between the organic El element 50 and the second TFT 20 is achieved by the wiring layer 40 (connector) which is a metal wiring, and at the contact section between the wiring layer 40 and the anode 52, the wiring layer 40 having a light blocking characteristic is present below the anode 52. Thus, in this region, the light from the emissive layer 55 cannot pass through to the side of the substrate 1. Therefore, if n contact sections are provided between the second TFTs 20 and the organic EL element 50 to correspond to the n second TFTs 20, the illumination area would be reduced in proportion to the number of contacts.

Therefore, in order to minimize the reduction in the illumination area, it is preferable to set the number of contacts between the second TFTs 20 and the organic EL element 50 to be less than or equal to (n−1), wherein the number of second TFTs 20 in one pixel is n (n≧2). In FIG. 8 and in FIGS. 12, 13, and 14 to be described below, n second TFTs 20 and the organic EL element 50 are connected with the number of contacts being equal to or less than (n−1). In the figures to be explained below, the components that are common to the figures already described will be assigned the same reference numerals and will not be described again.

Figure 12:
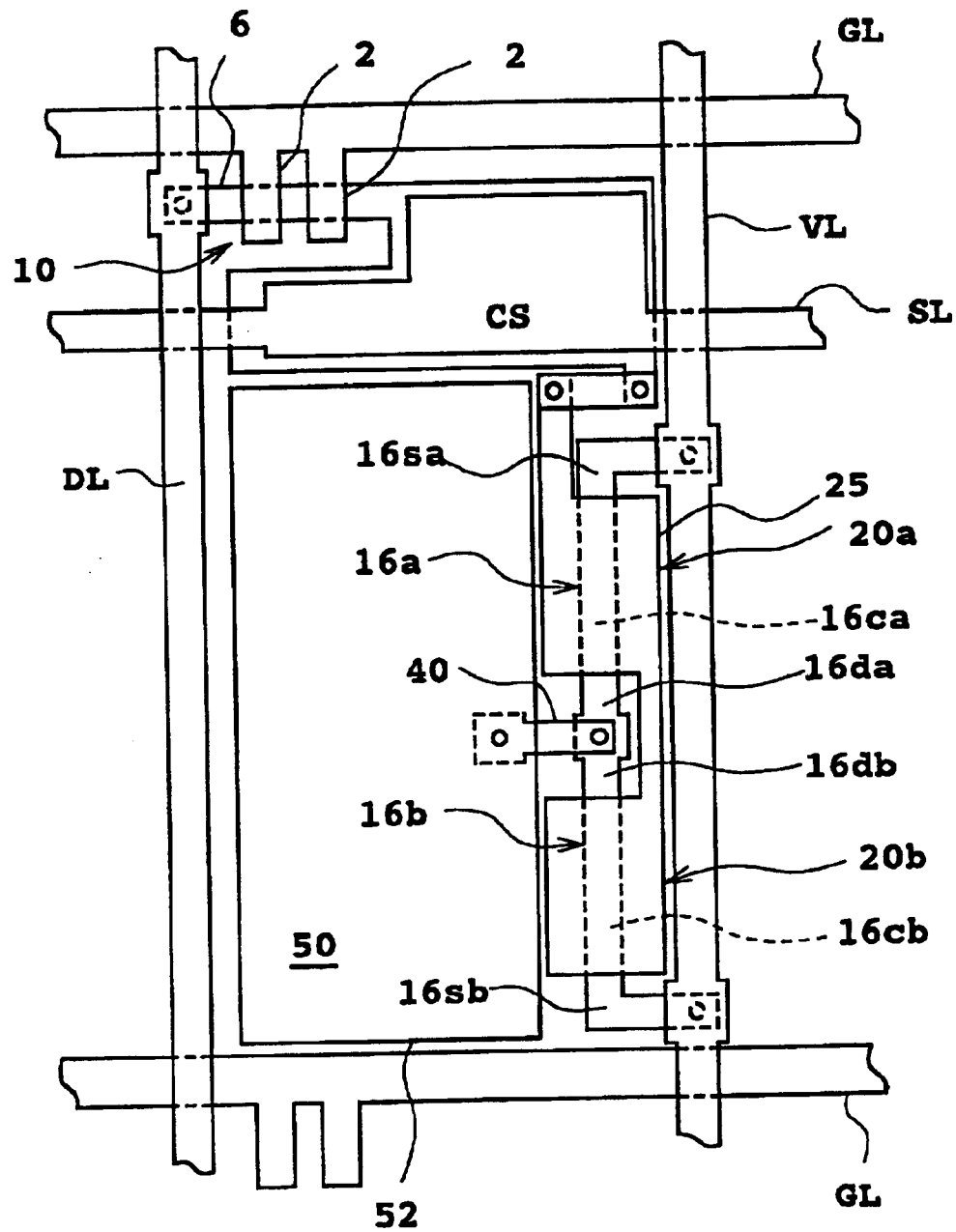
FIG. 12 is a planer diagram of one pixel of the active matrix type organic EL panel according to a third embodiment of the present invention.

FIG. 12 shows a contact method between second TFTs 20a and 20b and an organic EL element 50 when two second TFTs 20a and 20b are provided in parallel between the power supply line VL and the organic EL element 50. Similar to FIG. 11, the two TFTs 20a and 20b are placed such that respective channel length direction is parallel to the longitudinal direction of the pixel (the extension direction of the data line DL) or to the scan direction of laser annealing. The TFTs 20a and 20b are also placed so that they are shifted from each other. With such a configuration, as described above, the illumination variation among pixels can be reduced and the reliability can be improved.

In the example shown in FIG. 12, a semiconductor layer constructed from p-Si patterned into a single island-like manner is used for the active layers 16a and 16b of the second TFTs 20a and 20b. The semiconductor is patterned so that both ends in the column direction are the source regions (in the case of a pch-TFT) 16sa and 16sb of respective second TFTs 20a and 20b, and are connected to the power supply line VL. The region around the center of the semiconductor pattern defines the drain regions (in the case of a pch-TFT) 16da and 16db of the TFTs 20a and 20b, and the drain regions are connected to a single wiring layer 40 provided between the two TFTs via a common contact hole formed to penetrate through the interlayer insulation film 14 and the gate insulation film 4 (refer to FIG. 10B).

The wiring layer 40 extends to the anode formation region of the organic EL element 50. Similar to the cross sectional structure shown in FIG. 10B, the wiring layer 40 is connected to the anode 52 of the organic EL element 50 via one contact hole opened on the first flattening insulation layer 18. Here, the connection position between the wiring layer 40 and the anode 52 is set in FIG. 12 to be around the center of the anode 52 in the longitudinal direction of the pixel. The contact position is not limited to the configuration of FIG. 12, but by placing the contact position near the center of the anode 52 as shown in FIG. 12, averaging effect of the current density can be obtained in the formation region of the anode 52 which is constructed from an ITO or the like having a relatively high resistance compared to a metal electrode and, thus, the uniformity of the illumination brightness at the illumination surface of each pixel can be improved.

Figure 13:
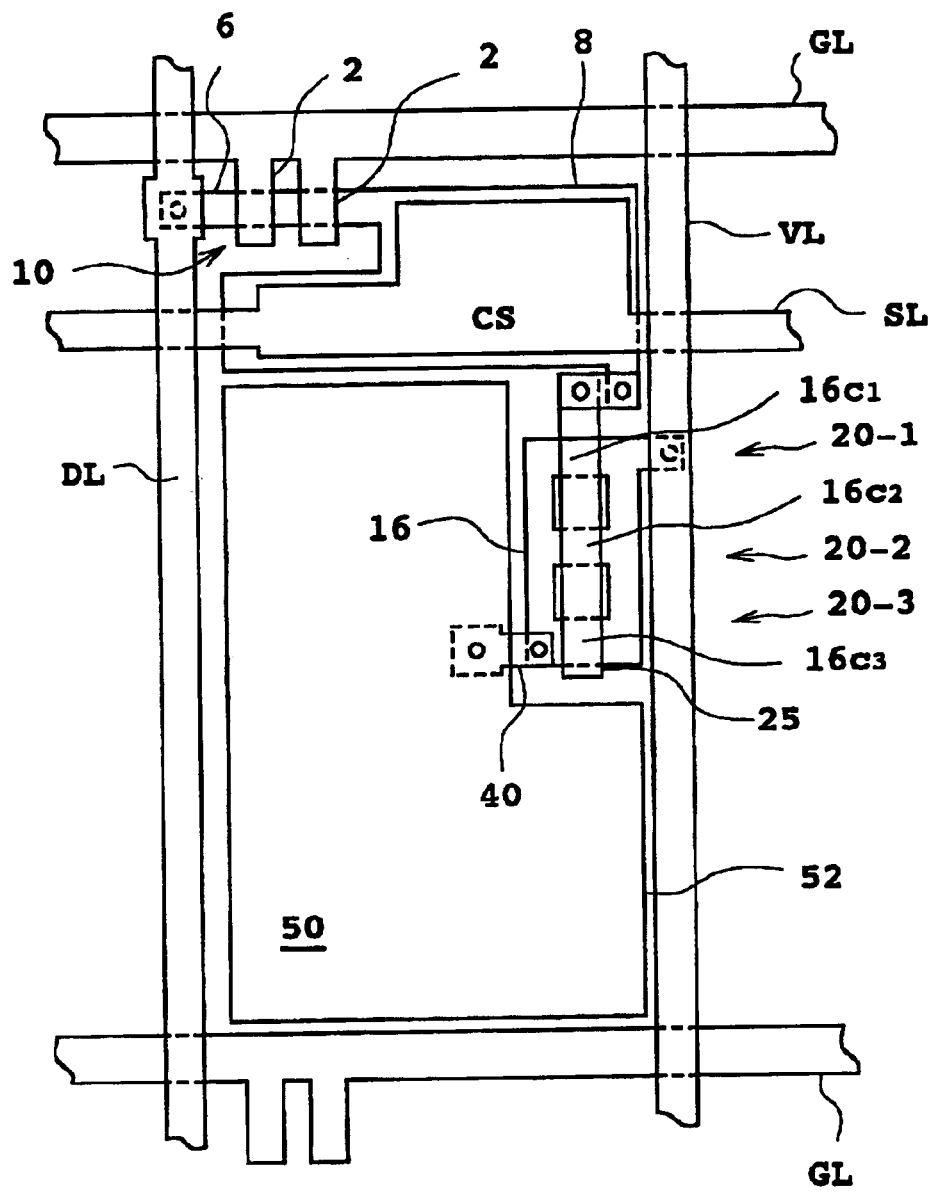
FIG. 13 shows another example of a planer structure of one pixel of the active matrix type organic EL element according to the third embodiment.

In the example shown in FIG. 13, the number of second TFTs 20 is increased to three. Three second TFTs 20-1, 20-2, and 20-3 are connected in parallel between the power supply line VL and the anode of the organic EL element 50. The active layer 16 of three second TFTs 20 are integrally formed and are set so that the channel length direction is along the row direction in FIG. 13. Each of the channel regions $16c_1$ through $16c_3$ of second TFTs 20-1 through 20-3 are separated in their channel width directions by openings in the pattern of the active layer 16.

Here, the three second TFTs 20 are connected to the power supply line VL at one contact point, and also connected to the anode 52 of the organic EL element 50 at one contact point by a single wiring layer 40. The gate electrode 25 is common to all three TFTs, is electrically connected to the second electrode 8 of the storage capacitor Cs, and is constructed from a metal wiring extending in the column direction from around the storage capacitor Cs. In the configuration example of FIG. 13, three second TFTs 20-1 through 20-3 are connected to the organic EL element 50 by one contact section. Therefore, the ratio of the occupational area of the contact section within the formation region of the organic EL element 50 can be lowered, and thus, the ratio of opening in one pixel, that is, the illumination area, can be increased.

Figure 14:
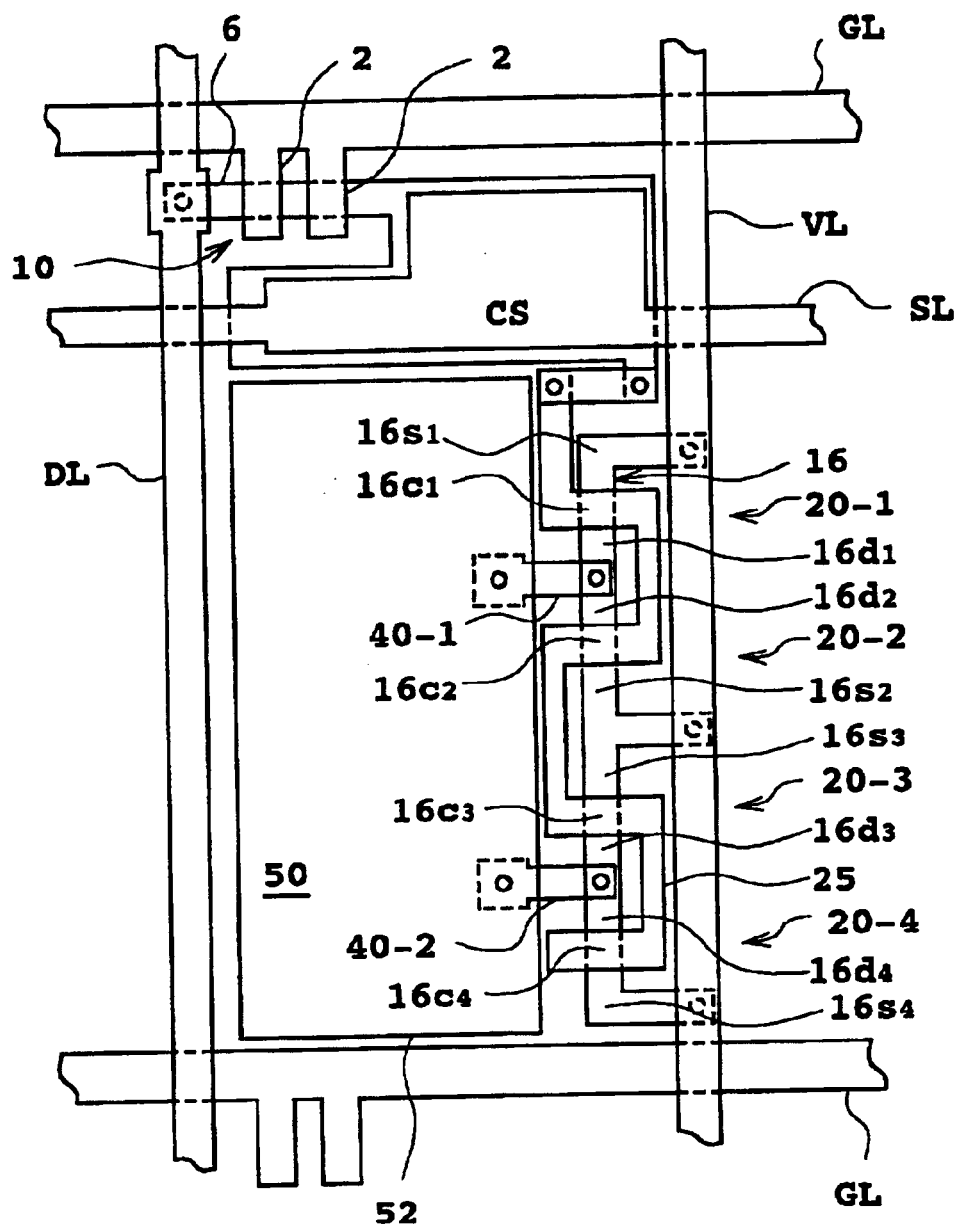
FIG. 14 shows yet another example of a planer structure of one pixel of the active matrix type organic EL panel according to the third embodiment.

In an example shown in FIG. 14, the number of second TFTs 20 is increased to 4. The four TFTs 20-1 through 20-4 are electrically connected in parallel between the power supply line VL and the anode 52 of the organic EL element 50. The active layer 16 of four second TFTs 20 are integrally constructed and the channel length directions of the TFTs 20-1 through 20-4 are set to be parallel to the longitudinal direction of the pixel region or the extension direction of the data line DL, similar to FIG. 12. The four TFTs are arranged in an almost straight line.

Four TFTs 20-1 through 20-4 are connected to the power supply line VL at three contact points, and connected to the anode 52 of the organic EL element 50 at two contact points by first and second wiring layers 40-1 and 40-2. In the example structure shown in FIG. 14, the source regions $16S_1$ and $16S_4$ of the TFTs 20-1 and 20-4 which are located at the outermost positions of the single active layer 16 are respectively connected to the power supply line VL as a separate entity. The source regions $16S_2$ and $16S_3$ of the TFTs 20-2 and 20-3 which are located at the central position are together connected to the power supply line VL. The second TFTs 20-1 and 20-2 and the organic EL element 50 are connected as follows. The drain regions $16d_1$ and $16d_2$ of the second TFTs 20-1 and 20-2 are connected to a first wiring layer 40-1 extending from between the second TFTs 20-1 and 20-2 to the element 50, and the first wiring layer 40-1 extends to the formation region of the organic EL element 50 and is connected to the anode 52 of the element. The second TFTs 20-3 and 20-4 are connected to the organic EL element 50 as follows. The drain regions $16d_3$ and $16d_4$ of the second TFTs 20-3 and 20-4 are connected to a second wiring layer 40-2 extending from between the second TFTs 20-3 and 20-4 to the element 50, and the second wiring layer 40-2 extends to the formation region of the organic EL element 50 and is connected to the anode 52 of the element. In this manner, four second TFTs 20-1 through 20-4 are connected to the organic EL element 50 only at two contact points, in order to inhibit the reduction of illumination region caused by providing four second TFTs 20-1 through 20-4.

In the configuration of FIG. 14, because the four second TFTs 20-1 through 20-4 are placed so that the channel length direction is directed almost in a straight line along the longitudinal direction of the pixel, it is possible to efficiently place the second TFTs 20-1 through 20-4 within one pixel.

As described above, according to the third embodiment, by connecting an element to be driven and a transistor for supplying power to the element by minimum number of contacts, necessary transistors and elements can be efficiently placed in a limited area. Therefore, when an EL element is used, for example, as the element to be driven, the illumination area ratio can be improved in one pixel unit.

Fourth Embodiment

A connection structure between the second TFT 20 and the organic EL element 50 will now be described referring to FIGS. 15 through 20. As described in the third embodiment, in a device in which light is transmitted through a transparent anode 52 and emitted outside from the lower substrate 1 (bottom emission), the contact region between the organic EL element 50 and the second TFT 20 is usually a non-illuminating region. Also, in order to improve the integration density in many integrated circuits, and in order to improve the resolution in a display device, it is desired to minimize the contact area. From such a viewpoint, when the active layer 16 of the second TFT 20 is directly connected to the anode 52 of the organic EL element 50 or when the direct connection is not employed and a metal connection layer (Al layer, Cr layer or the like) is provided in between for improving the connection characteristic, it is preferable to form the first contact hole 70 of the interlayer insulation film 14 and the second contact hole 72 of the first flattening insulation layer 18 to overlap each other, as shown in FIGS. 15A and 15B.

Figure 15A:
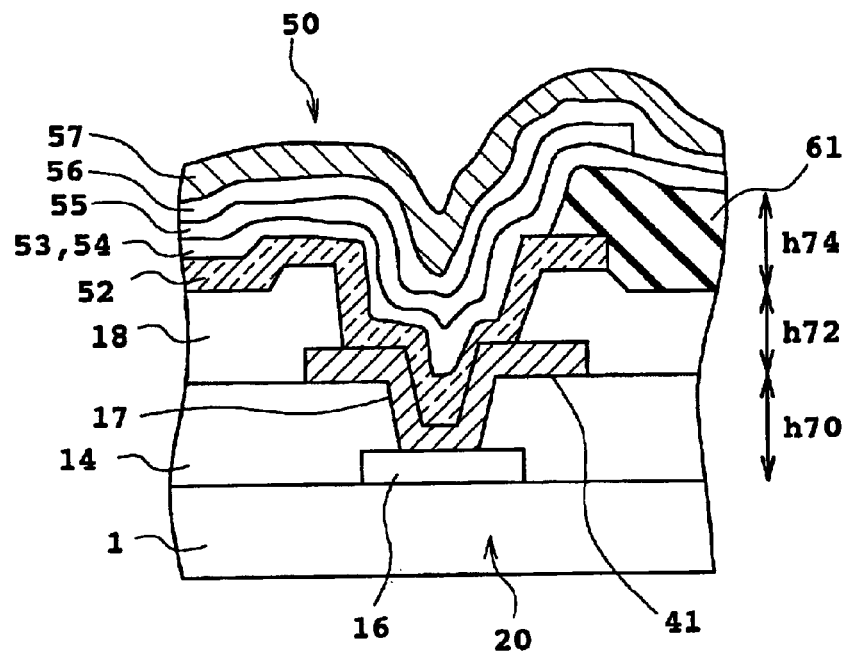
FIGS. 15A and 15B are diagrams respectively showing the cross sectional structure and planer structure of the contact section between the active layer 16 of the second TFT and the anode 52 of the organic EL element 50.
Figure 15B:
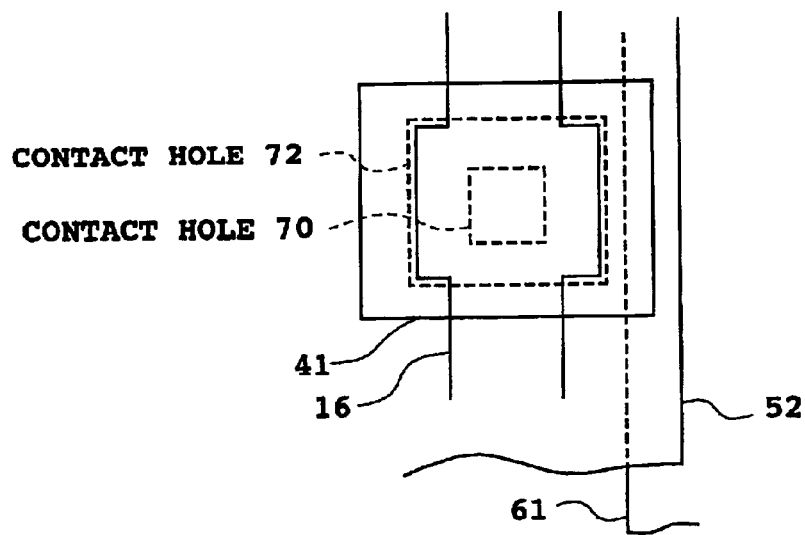

However, when a plurality of contact holes are formed to overlap each other as shown in FIG. 15A, the total step size (h70+h72) of the contact holes become large and, thus, the surface flatness of the layer formed on top of the contact hole is reduced. Moreover, there are some cases where a second flattening insulation layer 61 is used for covering the edge region of the anode 52 as shown in FIG. 15A in order to prevent shortage between the anode 52 and the cathode 57 caused by coverage failure of the emissive element layer 51 at the anode edge region. The second flattening (planarizating) insulation layer 61 is opened at the central region of the anode 52. Therefore, the opened section of the second flattening insulation layer 61 is formed near the first and second contract holes 70 and 72, and the formation surface of the emissive element layer 51 will be influenced also by the step h74 caused by the opening of the second flattening insulation layer 61.

In the organic EL element 50, on the other hand, illumination organic compound in the emissive layer 55 is illuminated by flowing a current through the emissive element layer 51. It is known that if there is a large difference in the thickness within the layer of the emissive element layer 51, an electric field concentration tends to occur at a portion that is thinner than the other portions, and a dark spot tends to be generated at such a portion. Dark spots degrade display quality, and furthermore, because dark spots tend to expand as the element is driven, each dark spot shortens the life of the element. Therefore, when the organic EL element 50 is formed at a layer above the contact region, it is desired to maximize the flatness of the formation surface of the emissive element layer 51. The contact structure shown in FIGS. 15A and 15B in which the emissive element layer 51 is formed on an uneven surface is not desirable from the viewpoint of improving the reliability of the emissive element layer 51.

Figure 16A:
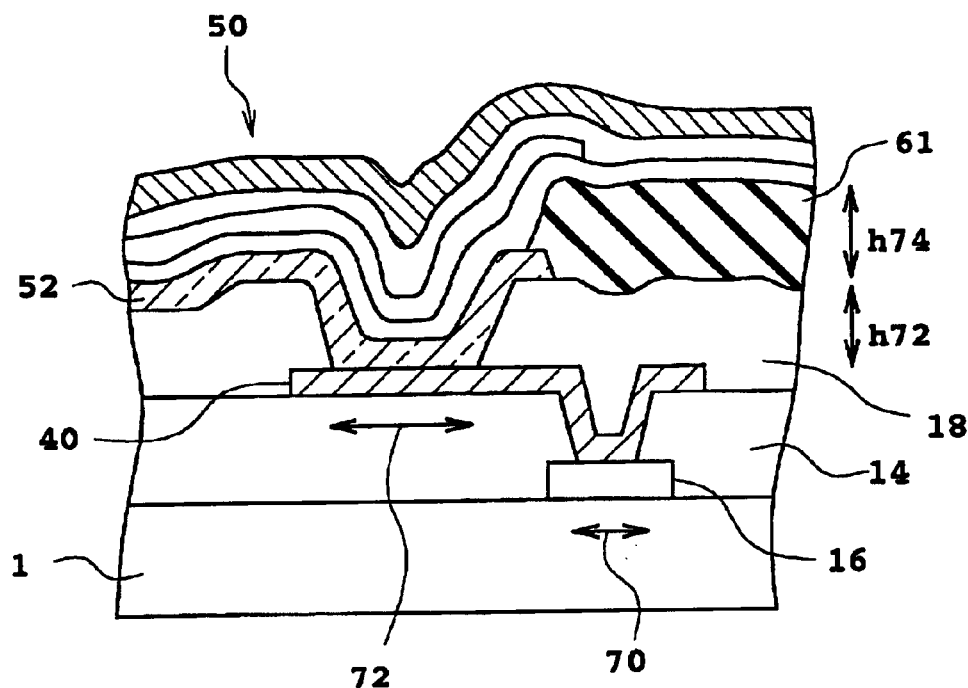
FIGS. 16A and 16B are diagrams respectively showing the cross sectional structure and planer structure of the contact section between the active layer 16 of the second TFT and the anode 52 of the organic EL element 50 according to a fourth embodiment of the present invention.
Figure 16B:
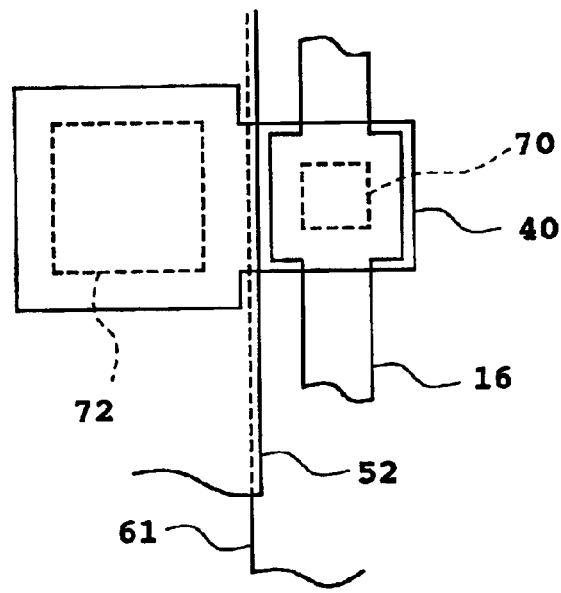

In consideration of the above, FIGS. 16A and 16B show an example of a connection method wherein the flatness at the formation surface of the emissive element layer 51 is increased, considering the above. FIG. 16A shows a cross sectional structure of the contact section between the active layer 16 of the second TFT 20 and the anode 52 of the organic EL element 50. FIG. 16B shows a schematic planer structure of the contact section. With exception of the presence of the second flattening insulation layer 61 for covering the edge region of the anode 52 and the second TFT being a top gate structure, the connection structure shown in FIGS. 16A and 16B is identical to the structure shown in FIGS. 8 and 9 as explained for the first embodiment. The connection position between the wiring layer 40 and the anode 52 is placed such that it is shifted with respect to the connection position between the wiring layer 40 and the active layer 16 of the second TFT 20. By employing such a configuration, the anode surface at the contact region between the wiring layer 40 and the anode 52, being the formation surface of the emissive element layer 51, is only influenced by the step h72 caused by the second contact hole 72 and is not influenced by the step h70 caused by the first contact hole 70 as in the case shown in FIGS. 15A and 15B. Therefore, as is clear from comparison between FIGS. 15A, B and 16A, B, the flatness of the formation surface for emissive element layer, especially at the illumination region of each pixel onto which the emissive layer 55 is formed can be improved.

Figure 17:
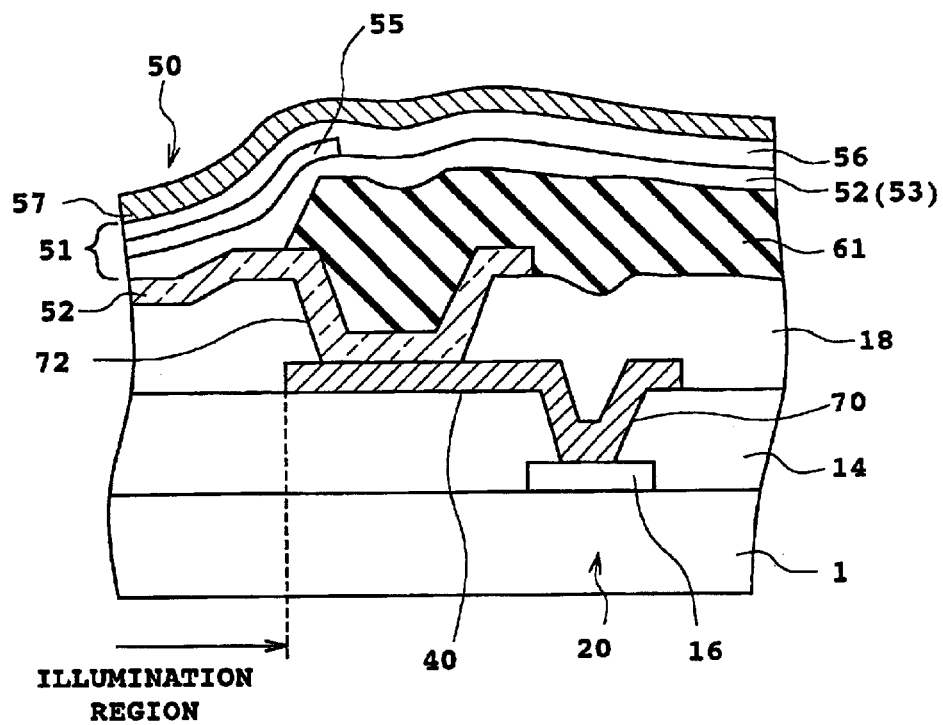
FIG. 17 is a diagram showing another example of a cross sectional structure of the contact section between the active layer 16 of the second TFT and the anode 52 of the organic EL element 50 according to the fourth embodiment.
Figure 18:
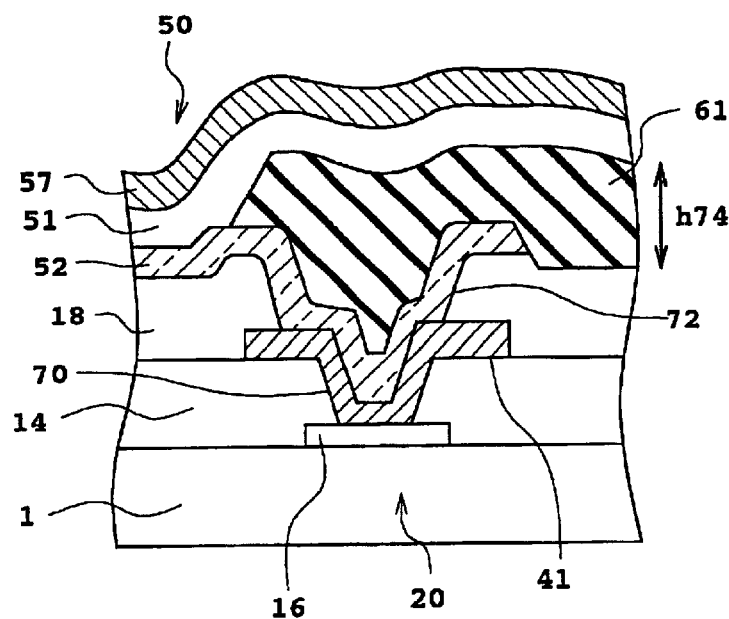
FIG. 18 is a diagram showing a further example of a cross sectional structure of the contact section between the active layer 16 of the second TFT and the anode 52 of the organic EL element 50 according to the fourth embodiment.

FIG. 17 shows a method for further flattening the formation surface of the emissive element layer as shown in FIG. 16A. In the example shown in FIG. 17, similar to FIG. 16A, the formation position of the second contact hole 72 for connecting the wiring layer 40 and the anode 52 of the organic EL element 50 is shifted from the formation position of the first contact hole 70, and, in addition, the second contact hole 72 is covered by the second flattening insulation layer 61. Therefore, the region onto which the emissive layer 55 is formed is neither influenced by the step caused by the first contact hole 70 nor by the step caused by the second contact hole 72. The flatness of the formation surface of the emissive element layer can thus be further improved. Because the second flattening layer 61 covers the edge region of the anode 52, shortage between the anode 52 and the cathode 57 or the like can reliably be prevented.

The illumination region of the organic EL element is a region in which the anode 52 and the cathode 57 oppose each other with the emissive layer 55 in between, and the region in which the second flattening insulation layer 61 is formed between the anode 52 and the emissive element layer 51 does not illuminate. Therefore, strictly speaking, with the configuration shown in FIG. 17, because the second flattening insulation layer 61 covers not only the edge of the anode 52 but also the section above the second contact hole 72, the illumination region is reduced. However, as described above, when the wiring layer 40 or the like which has a light blocking characteristic is formed at a lower layer, the formation region of the wiring layer 40 will be a non-illuminating region when seen from outside. Therefore, even when the structure shown in FIG. 17 in which the second flattening insulation layer 61 covers the second contact hole 72 is employed, the actual reduction in the illumination area due to the formation of the second flattening insulation layer 61 for one pixel can be inhibited.

The improvement effect on the flatness of the formation surface for the emissive element layer can also be achieved by the method of covering the contact hole by the second flattening insulation layer 61, by employing a layout wherein the first and second contact holes 70 and 72 are placed to overlap each other, as in FIGS. 15A and 15B. Specifically, as in the cross sectional structure of the contact section shown in FIG. 18, the active layer 16 of the second TFT 20 and the anode 52 of the organic EL element 50 are connected by first and second contact holes 70 and 72 formed to overlap each other, and the region of the anode 52 having the upper surface recessed because of two contact holes is covered by the second flattening insulation layer 61. The formation surface for the emissive element layer above the contact holes 70 and 72 will thus be a surface with a good flatness, formed by the second flattening insulation layer 61. Also, by placing the two contact holes 70 and 72 at the same position in FIG. 18, the element placement efficiency in one pixel is high and it is easy to contribute to an improvement in the illumination region.

Figure 19:
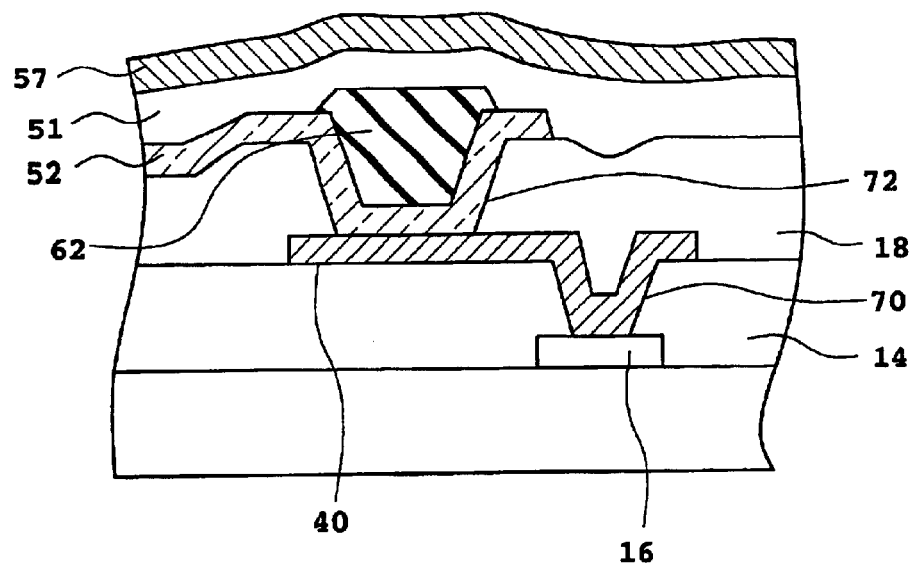
FIG. 19 is a diagram showing yet another example of a cross sectional structure of the contact section between the active layer 16 of the second TFT and the anode 52 of the organic EL element 50 according to the fourth embodiment.
Figure 20:
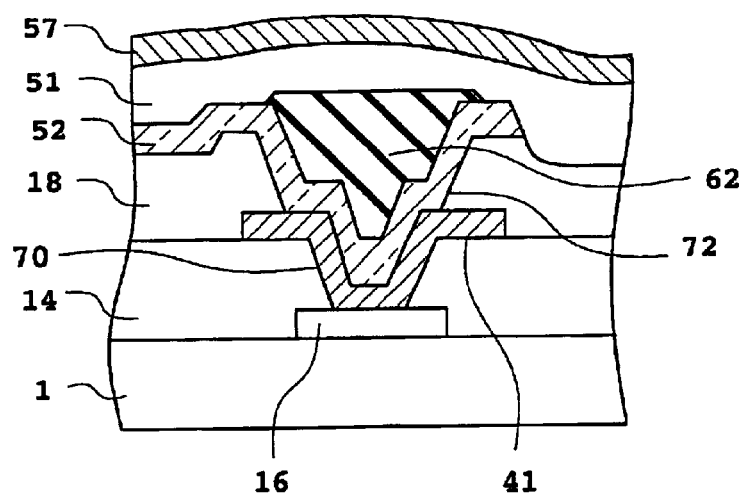
FIG. 20 is diagram showing another example of a cross sectional structure of the contact section between the active layer 16 of the second TFT and the anode 52 of the organic EL element 50 according to the third embodiment.

FIG. 19 shows another flattening method of the formation surface for the emissive element layer. The method of FIG. 19 differs from that of FIG. 17 in that a filling layer 62 is selectively formed on top of the anode 52 instead of the second flattening insulation layer 61, at the formation region of the second contact hole 72, in order to fill the recess caused by the contact hole. By selectively forming the filling layer 62 on top of the anode 52 for covering the contact hole 72, even when the second flattening insulation layer 61 or the like is not provided, the formation surface for the emissive element layer above the contact hole can be flattened. As shown in FIG. 20, the filling layer 62 may also be employed, similar to FIG. 19, for a case wherein the first and second contact holes 70 and 72 are formed to overlap each other. In FIG. 20, the filling layer 62 is selectively formed on the anode 52 at the region where the two contact holes are formed to overlap, in order to fill the deep recess formed by the two contact holes. In the cases illustrated in FIGS. 19 and 20, the emissive element layer 51 is formed on a flat surface of the filling layer 62 at the region where the contact hole or contact holes are formed and, thus, failures in the emissive element layer generating in this region can be prevented.

The material for the second flattening insulation layer 61 and for the filling layer 62 can be any material which has a flat upper surface, but it is preferable to use a stable and insulating material which does not react with the emissive element layer 51 and which is not hydrous. For example, polyimide, HMOSO, TOMCAT, or TEOS can be used.

As described above, according to the fourth embodiment, the flatness of the surface onto which the element to be driven such as an organic EL element, is formed can be improved, and thus, it is possible to improve the reliability of the element to be driven.

What is claimed is:

1. A semiconductor device comprising:
    n (n is an integer equal to or greater than 2) thin film transistors provided between an element to be driven which operates based on supplied power and a power supply line for supplying power to said element to be driven, for controlling, in accordance with a data signal, power supplied to said element to be driven; wherein the number of contact points for electrically connecting said n thin film transistors and corresponding element to be driven is equal to or less than (n−1).

2. A semiconductor device according to claim 1, wherein said n thin film transistors and corresponding element to be driven are electrically connected to each other by a wiring layer; and the contact position between the wiring layer and the thin film transistor is placed to be distant from the contact position between the wiring layer and said element to be driven.

3. A semiconductor device according to claim 2, wherein said element to be driven is an emissive element which includes an emissive element layer between a first electrode and a second electrode;

a contact hole is formed on an insulation layer which is formed above said wiring layer, said wiring layer being connected through the contact hole to said first electrode of said emissive element which is formed on top of said insulation layer and covering said contact hole;

at least the contact hole region of said first electrode is covered by a flattening layer; and said emissive element layer is formed above said first electrode and said flattening layer.

4. A semiconductor device according to claim 1, wherein said n thin film transistors and corresponding element to be driven are directly or indirectly and electrically connected to each other at a contact hole formed on an insulation layer for separating said thin film transistor which is formed at a lower layer and said element to be driven;

at least the contact hole region of said first electrode is covered by a flattening layer; and an emissive element layer is formed above said first electrode and said flattening layer.

5. A semiconductor device according to claim 1, wherein said element to be driven is an organic electroluminescence element which uses an organic compound in an emissive layer.

6. A semiconductor device comprising:

n (n is an integer equal to or greater than 2) thin film transistors provided between an element to be driven which operates based on supplied power and a power supply line for supplying power to said element to be driven, for controlling power supplied to said element to be driven; and a switching thin film transistor connected to a data line, for operating in accordance with a gate signal to capture a data signal from said data line; wherein each of said n thin film transistors supplies power from said power supply line to said element to be driven, in accordance with said data signal captured by said switching thin film transistor, and the number of contact points for electrically connecting said n thin film transistors and corresponding element to be driven is equal to or less than (n−1).

7. A semiconductor device according to claim 6, wherein said element to be driven is a current-driven electroluminescence element.

* * * * *